United States Patent
Pang

(10) Patent No.: US 8,672,723 B2
(45) Date of Patent: Mar. 18, 2014

(54) TOP EMISSION TYPE ORGANIC ELECTROLUMINESCENT DISPLAY DEVICE AND METHOD OF FABRICATING THE SAME

(75) Inventor: Hee-Suk Pang, Pyeongtaek-si (KR)

(73) Assignee: LG Display Co., Ltd., Seoul (KR)

( * ) Notice: Subject to any disclaimer, the term of this patent is extended or adjusted under 35 U.S.C. 154(b) by 75 days.

(21) Appl. No.: 13/543,442

(22) Filed: Jul. 6, 2012

(65) Prior Publication Data

US 2012/0301987 A1    Nov. 29, 2012

Related U.S. Application Data

(62) Division of application No. 12/461,921, filed on Aug. 27, 2009, now Pat. No. 8,237,358.

(30) Foreign Application Priority Data

Dec. 2, 2008    (KR) ........................ 10-2008-0121273

(51) Int. Cl.
*H01J 9/26*    (2006.01)
(52) U.S. Cl.
USPC .............................. 445/25; 313/506; 313/512
(58) Field of Classification Search
USPC ................................ 445/24–25; 313/498–512
See application file for complete search history.

(56) References Cited

U.S. PATENT DOCUMENTS

| | | | | |
|---|---|---|---|---|
| 2007/0228943 | A1* | 10/2007 | Yamada et al. | 313/504 |
| 2008/0157663 | A1* | 7/2008 | Sung et al. | 313/504 |
| 2009/0200931 | A1* | 8/2009 | Takei et al. | 313/504 |

FOREIGN PATENT DOCUMENTS

KR    10-2006-0045472    5/2006

* cited by examiner

*Primary Examiner* — Anne Hines
(74) *Attorney, Agent, or Firm* — McKenna Long & Aldridge, LLP

(57) ABSTRACT

A top emission type organic electroluminescent display device includes a first substrate including a pixel region, a switching TFT and a driving TFT, a passivation layer exposing a drain electrode of the driving TFT, a connection electrode contacting the drain electrode of the driving TFT, a partition wall corresponding to a border between adjacent pixel regions and overlapping an edge portion of the connection electrode, an x-ray shield layer on the connection electrode between adjacent partition walls, the x-ray shield layer patterned in the pixel region due to the partition wall, a first electrode on the x-ray shield layer, a bank covering the partition wall and contacting an edge portion of the first electrode, an organic emission layer on the first electrode between adjacent banks, a second electrode on the organic emission layer, and a second substrate facing the first substrate and being transparent.

5 Claims, 21 Drawing Sheets

TOP EMISSION TYPE ORGANIC ELECTROLUMINESCENT DISPLAY DEVICE AND METHOD OF FABRICATING THE SAME

CROSS-REFERENCE TO RELATED APPLICATIONS

This application is a Divisional of application Ser. No. 12/461,921 filed Aug. 27,2009 now U.S. Pat. No. 8,237,358, now allowed, which claims priority to Korean Patent Application No. 10-2008-0121273, filed Dec. 2, 2008, all of which are hereby incorporated by reference for all purposes as if fully set forth herein.

BACKGROUND OF THE INVENTION

1. Field of the Invention

The present invention relates to an organic electroluminescent display device, and more particularly, to a top emission type organic electroluminescent display device and a method of fabricating the same.

2. Discussion of the Related Art

Among flat panel displays, organic electroluminescent displays, have properties of high brightness and low driving voltages. In addition, because they are self-luminous, the organic electroluminescent displays have excellent contrast ratios and have ultra thin thicknesses. The organic electroluminescent displays have response time of several micro seconds, and there are advantages in displaying moving images. The organic electroluminescent displays have wide viewing angles and are stable under low temperatures. Since the organic electroluminescent displays are driven by low voltage of direct current (DC) 5V to 15V, it is easy to design and manufacture driving circuits.

The organic electroluminescent displays are classified into a passive matrix type and an active matrix type. In the passive matrix type, scan lines and signal lines cross each other to form diodes, and the signal lines are sequentially scanned to drive each pixel. To obtain required average brightness, instant brightness is needed which is the product of average brightness and the number of lines.

On the other hand, in the active matrix type, a thin film transistor, as a switching element, is formed in each sub-pixel. A first electrode connected to the thin film transistor turns on/off by the sub-pixel, and a second electrode facing the first electrode functions as a common electrode. In addition, a voltage applied to the sub-pixel is stored in a storage capacitor, and the voltage is maintained until the signal of next frame is applied. Accordingly, regardless of the number of the scan lines, the sub-pixels are continuously driven during one frame. Even though low currents are applied, brightness may be constant. Therefore, recently, the active matrix type organic electroluminescent displays have widely used because of their low power consumption, high definition and large-sized possibility.

FIG. 1 is an equivalent circuit diagram illustrating a pixel of an active matrix organic electroluminescent display device according to the related art.

In FIG. 1, the pixel of the active matrix organic electroluminescent display device includes a switching thin film transistor STr, a driving thin film transistor DTr, a storage capacitor StgC, and an organic electroluminescent diode E.

More particularly, a gate line GL is formed along a first direction. A data line DL is formed along a second direction crossing the first direction and defines a pixel region P with the gate line GL. A power line PL for supplying a source voltage is spaced apart from the data line DL.

The switching thin film transistor STr is formed at a crossing portion of the gate line GL and the data line DL. The driving thin film transistor DTr is electrically connected to the switching thin film transistor STr. The organic electroluminescent diode E includes a first electrode connected to a drain electrode of the driving thin film transistor DTr and a second electrode connected to the power line PL. The power line PL supplies the source voltage to the organic electroluminescent diode E. The storage capacitor StgC is formed between a gate electrode and a source electrode of the driving thin film transistor DTr.

A scan signal is applied to the switching thin film transistor STr through the gate line GL, and the switching thin film transistor STr turns on. Then, a data signal from the data line DL is supplied to the gate electrode of the driving thin film transistor DTr, and the driving thin film transistor DTr turns on. Accordingly, the organic electroluminescent emits light. Here, when the driving thin film transistor DTr is in on-state, levels of currents flowing in the organic electroluminescent diode E from the power line PL are determined. The organic electroluminescent diode E has gray scales according to the levels of the currents. When the switching thin film transistor STr turns off, the storage capacitor StgC maintains a gate voltage of the driving thin film transistor DTr constant. Even though the switching thin film transistor STr is in off-state, the levels of the currents flowing in the organic electroluminescent diode D are constantly maintained until a next frame.

The organic electroluminescent display device is classified into a top emission type and a bottom emission type according to a direction of light emitted from the organic electroluminescent diode. The bottom emission type has a disadvantage of low aperture ratio, and recently the top emission type has been widely used.

FIG. 2 is a schematic cross-sectional view of a top emission type organic electroluminescent display device according to the related art.

In FIG. 2, first and second substrates 10 and 70 are disposed to face each other. Peripheries of the first and second substrates 10 and 70 are sealed by a seal pattern 80. A driving thin film transistor DTr is formed in each pixel region P on the first substrate 10. A passivation layer 40 is formed on the driving thin film transistor DTr and has a drain contact hole 43. A first electrode 47 is formed on the passivation layer 40 and contacts an electrode (not shown) of the driving thin film transistor DTr through the drain contact hole 43.

An organic emission layer 55 is formed on the first electrode 47 in each pixel region P. The organic emission layer 55 includes red, green and blue organic luminous patterns 55a, 55b and 55c each corresponding to the pixel region P. A second electrode 58 is formed on the organic emission layer 55 all over the surface of the first substrate 10. The first and second electrodes 47 and 58 provide electrons and holes. The first electrode 47, the organic emission layer 55 and the second electrode 58 sequentially layered constitute an organic electroluminescent diode E.

The first substrate 10 and the second substrate 70 are attached by the seal pattern 80, and the second electrode 58 on the first substrate 10 is spaced apart from the second substrate 70.

FIG. 3 is a cross-sectional view of a pixel region of a top emission type organic electroluminescent display device according to the related art. The pixel region includes a driving thin film transistor.

In FIG. 3, the driving thin film transistor DTr is formed on a first substrate 10. The driving thin film transistor DTr includes a gate electrode 13, a gate insulating layer 16, a semiconductor layer 20 including an active layer 20a and ohmic contact layers 20b, and source and drain electrodes 33 and 36 sequentially layered on the first substrate 10. The active layer 20a is formed of intrinsic amorphous silicon. The ohmic contact layers 20b are formed of impurity-doped amorphous silicon and are spaced apart from each other on the active layer 20a. The source and drain electrodes 33 and 36 are spaced apart from each other and are connected to a power line (not shown) and an organic electroluminescent diode E, respectively.

The organic electroluminescent diode E includes first and second electrodes facing each other and an organic emission layer 55 interposed therebetween. The first electrode 47 is formed in each pixel region P and contacts an electrode of the driving thin film transistor DTr. The second electrode 58 is formed on the organic emission layer 55 all over the surface of the first substrate 10.

A second substrate 70 for encapsulation is disposed over and faces the first substrate 10 including the above-mentioned elements, and the first and second substrates 70 form an organic electroluminescent display device 1.

In the top emission type organic electroluminescent display device 1, when the driving thin film transistor DTr is a p-type, the first electrode 47 is formed of a transparent conductive material having relatively high work function, such as indium tin oxide or indium zinc oxide, so as to function as an anode electrode, and the second electrode 58 is formed of a metallic material having relatively low work function so as to function as a cathode electrode.

However, the metallic material, which is used for the second electrode 58 functioning as the cathode electrode and has relatively low work function, is opaque. Therefore, if the opaque metallic material is deposited to have a thickness of an ordinary electrode or insulating layer, that is, several thousand angstroms (Å), light cannot pass through the second electrode 58, and the top emission cannot be achieved.

To keep its transparency, the second electrode 58, which is formed of an opaque metallic material having relatively low work function, may have a double-layered structure including a lower layer (not shown) of an opaque metallic material and an upper layer (not shown) of a transparent conductive material, wherein the lower layer has a thickness of several ten angstroms (Å) to several hundred angstroms (Å), and the upper layer has a thickness of several thousand angstroms (Å). With respect to the first electrode 47, which is formed of a transparent conductive material having relatively high work function and functions as an anode electrode, a reflective layer (not shown) of a material having relatively high reflectivity is further formed under the first electrode 47 to reflect light and increase emission efficiency.

However, the transparent conductive material is generally deposited by a sputtering method. The sputtering method has a mechanism in which atoms or molecules are ejected from a target due to collision with particles having high energy and are adsorbed to a surface of a substrate. Accordingly, the atoms or particles have high energy and thus damage the surface of the substrate or a treated material layer. Particularly, since an organic insulating layer is formed by a thermal deposition method and has a relatively weak surface, it is impossible to form a transparent conductive layer on the organic insulating layer by the sputtering method. In addition, when a transparent conductive layer is formed on a metallic layer, which is formed of a thermal deposition method, by the sputtering method, the metallic layer may be transformed due to surface damage or may have poor functions because the particles from the target penetrate into the metallic layer and lower the properties of the metallic layer.

To solve the problem, an electron beam deposition method has been suggested as a method for depositing a transparent conductive material. In the electron beam deposition method, an electron beam, which is generated from a thermal ion electron beam gun or a plasma electron beam gun, is irradiated to a target, and the target is partly heated and evaporated to thereby form a layer, which is made of a material for the target, on a surface of a substrate. Accordingly, there is no damage on the surface of the substrate, and even though a film has a weak surface, a predetermined material layer can be formed on the film by the electron beam deposition method without damage.

By the way, the electron beam method causes another problem. When the electron beam is generated or the electro beam is irradiated to the target, X-ray is generated. The X-ray goes into the driving and switching thin film transistors under the first electrode and decreases characteristics of the thin film transistors. Especially, when the X-ray is incident on a channel of a thin film transistor, off currents of the thin film transistor rapidly increase, and a threshold voltage increases. Therefore, functions of the thin film transistor are remarkably lowered.

Accordingly, to form a film by the electron beam deposition method, a shield layer for blocking the X-ray is needed over the driving and switching thin film transistors. The shield layer is formed of a metallic material having an atomic density of about 10 g/cm$^3$ to about 30 g/cm$^3$, for example, tungsten or lead. Here, since lead has a relatively very low melting point, lead can be melted during a thermal deposition process, and tungsten may be used as an x-ray shield layer.

However, tungsten has been seldom used in the organic electroluminescent display device, and it has not been considered that etchant for tungsten affects elements of the organic electroluminescent display device. According to this, when etching tungsten, other elements may be removed together. Moreover, etching bath and rinse equipment for patterning tungsten are required, and this causes an increase in initial equipment costs.

SUMMARY OF THE INVENTION

Accordingly, the present invention is directed to a top emission type organic electroluminescent display device and a method of fabricating the same that substantially obviates one or more of the problems due to limitations and disadvantages of the related art.

An object of the present invention is to provide a top emission type organic electroluminescent display device and a method of fabricating the same that include an x-ray shield layer for electron beam deposition, wherein the x-ray shield layer is formed of tungsten and automatically patterned by the pixel region.

Another object of the present invention is to provide a top emission type organic electroluminescent display device and a method of fabricating the same that do not need additional equipment and costs.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a top emission type organic electroluminescent display device includes a first substrate including a pixel region, a switching thin film transistor and a driving thin film transistor in the pixel region on the first substrate, a passivation layer covering the switching thin film transistor and the driving thin film transistor and exposing a drain electrode of the driving thin film transistor, a connection electrode on the passivation layer and contacting the drain electrode of the driving thin film transistor, a partition wall corresponding to a border between adjacent pixel regions and overlapping an edge portion of the connection electrode, an x-ray shield layer on the connection electrode between adjacent partition walls, the x-ray shield layer automatically patterned in the pixel region due to the partition wall, a first electrode on the x-ray shield layer, a bank covering the partition wall and contacting an edge portion of the first electrode, an organic emission layer on the first electrode between adjacent banks, a second electrode on the organic emission layer, and a second substrate facing the first substrate and being transparent.

In another aspect, a method of fabricating a top emission type organic electroluminescent display device includes forming a switching thin film transistor and a driving thin film transistor in a pixel region on a first substrate, forming a passivation layer over the switching thin film transistor and the driving thin film transistor, the passivation layer having a drain contact hole exposing a drain electrode of the driving thin film transistor, forming a connection electrode in the pixel region on the passivation layer, the connection electrode contacting the drain electrode of the driving thin film transistor through the drain contact hole, forming a partition wall on the connection electrode and corresponding to a border between adjacent pixel regions, the partition wall overlapping an edge portion of the connection electrode having a width of a top surface wider than a width of a bottom surface, forming an x-ray shield layer on the connection electrode and automatically separated in the pixel region due to the partition wall by depositing tungsten over a substantially entire surface of the first substrate, forming a first electrode on the x-ray shield layer and automatically separated in the pixel region due to the partition wall, forming a bank of an inorganic insulating material, the bank covering the partition wall and contacting an edge portion of the first electrode, forming an organic emission layer on the first electrode between adjacent banks, forming a second electrode on the organic emission layer by an electron beam deposition method, and attaching the first substrate and a second substrate such that a seal pattern is formed between the first and second substrates along peripheries of the first and second substrates.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to the illustrated embodiments of the present invention, which are illustrated in the accompanying drawings.

Figure 1:
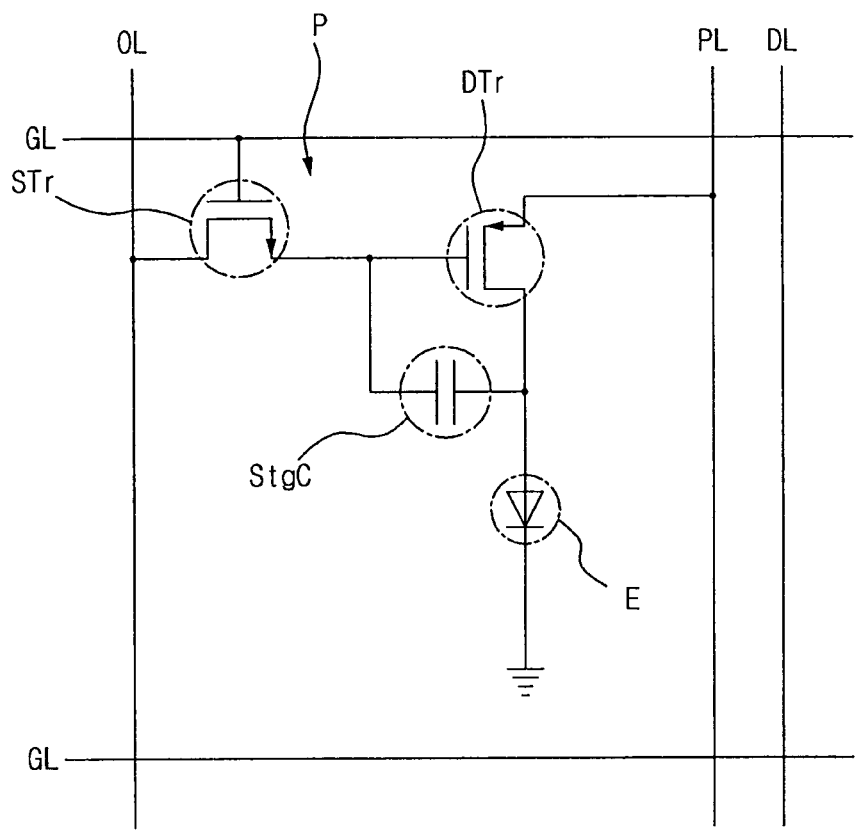
FIG. 1 is an equivalent circuit diagram illustrating a pixel of an active matrix organic electroluminescent display device according to the related art.
Figure 2:
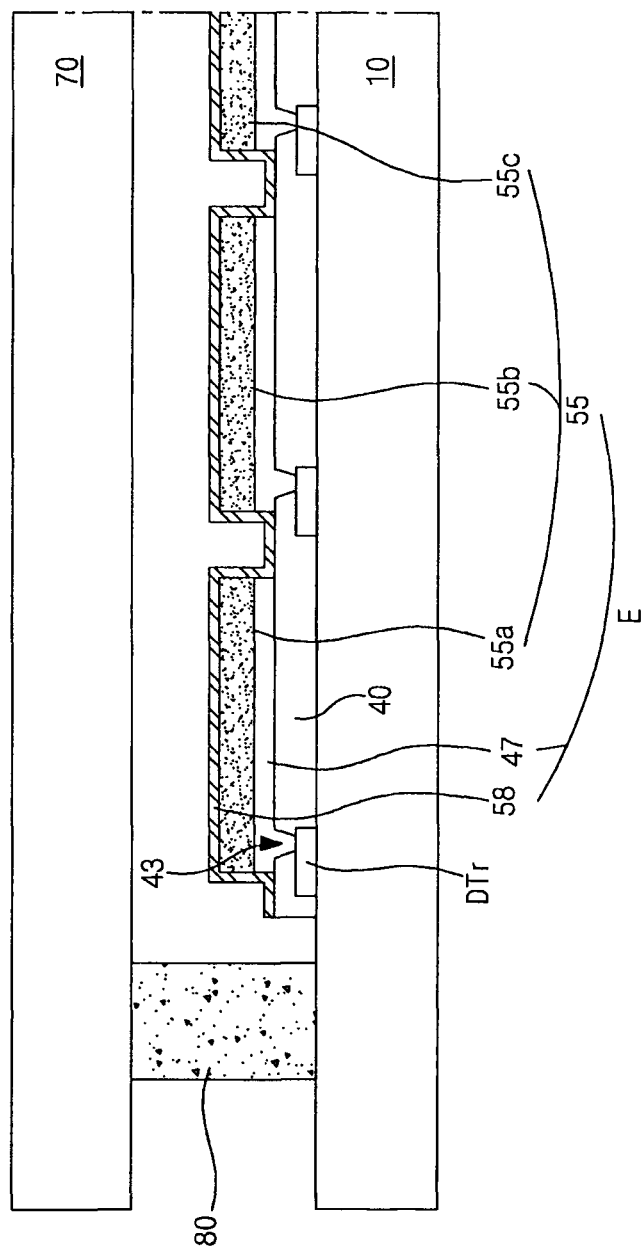
FIG. 2 is a schematic cross-sectional view of a top emission type organic electroluminescent display device according to the related art.
Figure 3:
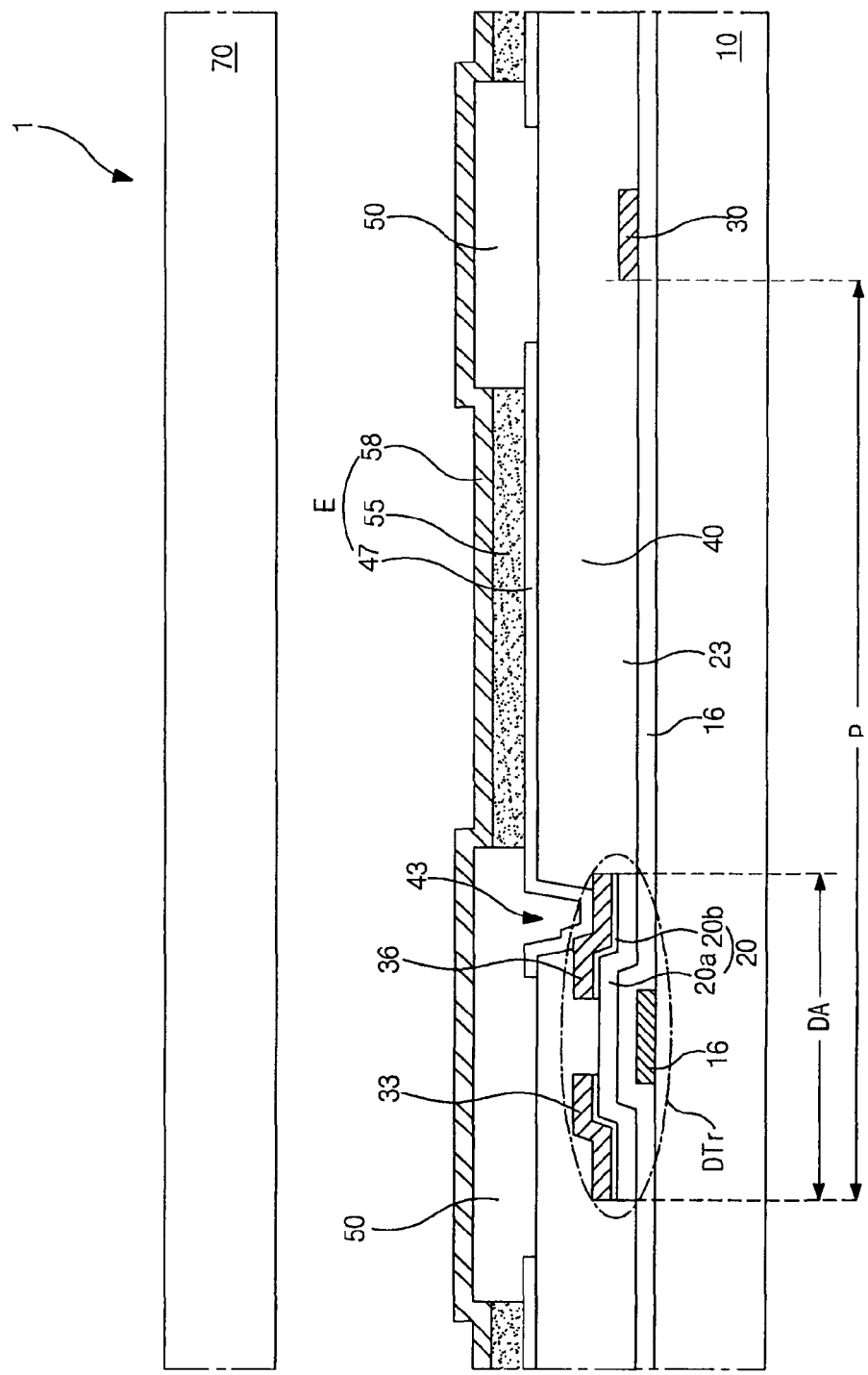
FIG. 3 is a cross-sectional view of a pixel region of a top emission type organic electroluminescent display device according to the related art. The pixel region includes a driving thin film transistor.
Figure 4A:
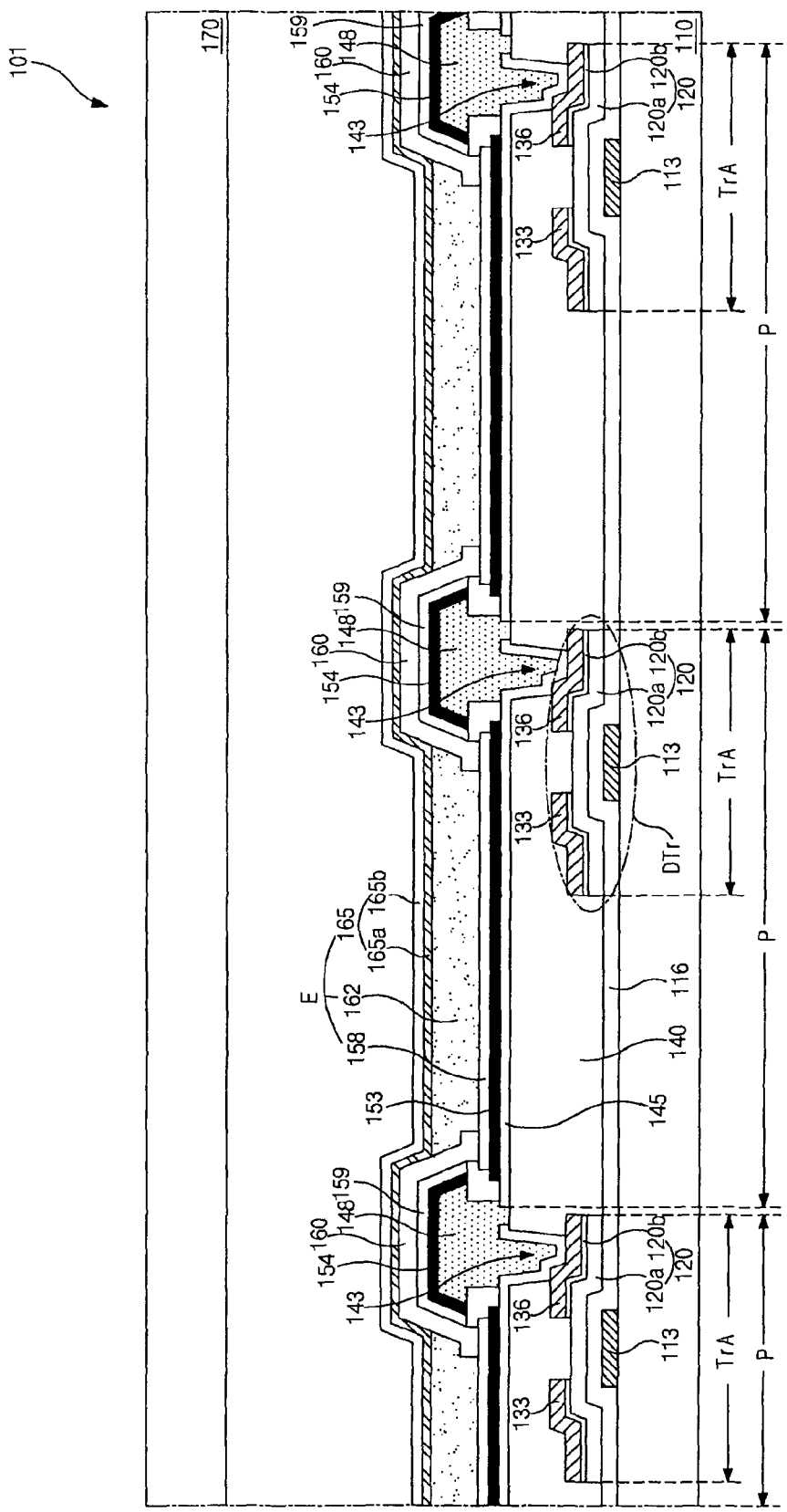
FIGS. 4A and 4B are cross-sectional views illustrating a top emission type organic electroluminescent display device according to a first embodiment of the present invention.
Figure 4B:
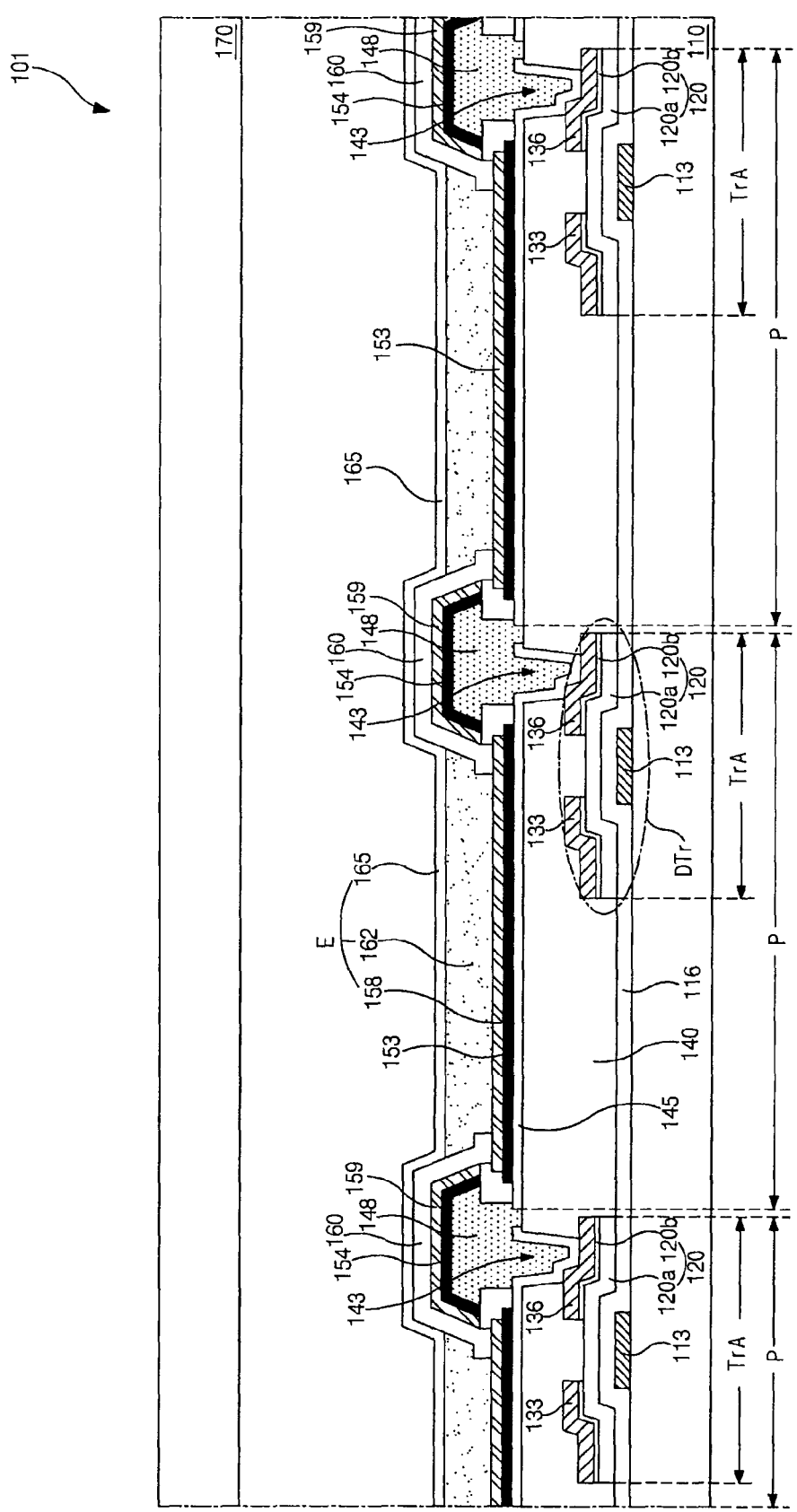

FIGS. 4A and 4B are cross-sectional views illustrating a top emission type organic electroluminescent display device according to a first embodiment of the present invention. FIG. 4A shows an example in which a first electrode functions as an anode electrode, and FIG. 4B shows another example in which the first electrode functions as a cathode electrode. For convenience of explanation, an area where a driving thin film transistor DTr is defined as a driving area TrA, and although not shown in the figures, an area where a switching thin film transistor is defined as a switching area. In addition, FIGS. 4A and 4B have similar structures except for first and second electrodes including different layers and materials, and the structure of FIG. 4A may be mainly described.

As shown in the figures, the top emission type organic electroluminescent display device 101 according to the present invention includes first and second substrates 110 and 170, wherein a driving thin film transistor DTr, a switching thin film transistor (not shown) and an organic electroluminescent diode E are formed on the first substrate 110, and the second substrate 170 is used for encapsulation.

More particularly, a gate line (not shown) and a gate electrode 113 are formed on the first substrate 110. The gate line is extended along a first direction. The gate electrode 113 is disposed in each of the driving area DA and the switching area (not shown). Although not shown in the figure, the gate electrode in the switching area is connected to the gate line. A gate insulating layer 116 is formed on the gate line (not shown) and the gate electrode 113 all over the surface of the first substrate 110. A data line (not shown) is formed on the gate insulating layer 116 and is extended along a second direction. The data line crosses the gate line to define a pixel region P. A semiconductor layer 120 is formed in each of the driving area TrA and the switching area (not shown) on the gate insulating layer 116 and corresponds to the gate electrode 113. The semiconductor layer 120 includes an active layer 120a of intrinsic amorphous silicon and ohmic contact layers 120b of impurity-doped amorphous silicon. The ohmic contact layers 120b are spaced apart from each other on the active layer 120a. Source and drain electrodes 133 and 136 are formed and spaced apart from each other on the ohmic contact layers 120b. Although not shown in the figure, the source electrode in the switching area is connected to the data line.

The gate electrode 113, the gate insulating layer 116, the semiconductor layer 116, and the source and drain electrodes 133 and 136 sequentially layered in the driving area TrA form the driving thin film transistor DTr. Even though the driving thin film transistor DTr is a bottom gate type, the structure shown in the figure is an example, and various modifications and changes can be made. For example, the driving thin film transistor DTr may have a top gate structure, which sequentially includes a semiconductor layer of polycrystalline silicon, a gate insulating layer, a gate electrode, an inter insulating layer with semiconductor contact holes exposing the semiconductor layer, and source and drain electrodes spaced apart from each other and connected to the semiconductor layer through the semiconductor contact holes. The switching thin film transistor (not shown) in the switching area (not shown) has the same structure as the driving thin film transistor DTr.

Next, a passivation layer 140 is formed over the driving thin film transistor DTr and the switching thin film transistor (not shown). The passivation layer 140 includes a drain contact hole 143 exposing the drain electrode 136 of the driving thin film transistor DTr. A connection electrode 145 is formed on the passivation layer 140 in each pixel region P. The connection electrode 145 is connected to the drain electrode 136 of the driving thin film transistor DTr through the drain contact hole 143. The connection electrode 145 may be formed of a transparent conductive material, such as indium tin oxide or indium zinc oxide, or may be formed of a metallic material having a relatively low resistivity, for example, aluminum (Al), aluminum alloy such as aluminum neodymium (AlNd), copper (Cu), copper alloy or chromium (Cr).

A partition wall 148 is formed on the connection electrode 145 and corresponds to a border between adjacent pixel regions P. The partition wall 148 is undercut and has a cross-section of a mushroom-like shape, that is, an overhang shape in which an upper part has a wide width than a lower part. An x-ray shield layer 153 is formed on the connection electrode 145 and in the pixel region P surrounded by the partition wall 148. The x-ray shield layer 153 is automatically separated and patterned due to the partition wall 148. The x-ray shield layer 153 may be formed of a metallic material having an atomic density of about 10 g/cm³ to about 30 g/cm³, for example, tungsten.

A first electrode 158 is formed on the x-ray shield layer 153. In FIG. 4A, the first electrode 158 functions as an anode electrode and is formed of a conductive material having relatively high work function and being transparent, for example, indium tin oxide or indium zinc oxide. In FIG. 4B, the first electrode 158 functions as a cathode electrode and is formed of a metallic material having relatively low work function, for example, aluminum (Al) or aluminum alloy such as aluminum neodymium (AlNd). Here, in the same way as the x-ray shield layer 153, the first electrode 158 is automatically separated and patterned due to the partition wall 148, which has the cross-section of the overhang shape and surrounds the pixel region P, and is formed in each pixel region P. On the other hand, first and second dummy patterns 154 and 159, which, respectively, include the same materials as the x-ray shield layer 153 and the first electrode 158, are sequentially formed on a top surface and a side surface of the partition wall 148.

A bank 160 of an inorganic insulating material is formed over the partition wall 148. The bank 160 completely covers the first and second dummy patterns 154 and 159. The bank 160 partially covers the first electrode 158, which is separated and formed by the pixel region P, that is, the bank 160 overlaps edge portions of the first electrode 158.

An organic emission layer 162 is formed on the first electrode 147. A second electrode 165 is formed on the organic emission layer 162 and the bank 160 all over the surface of the first substrate 110. The first and second electrodes 158 and 165 and the organic emission layer 162 interposed therebetween constitute the organic electroluminescent diode E.

In FIG. 4A, the second electrode 165 should be formed of a metallic material having relatively low work function, for example, aluminum (Al) or aluminum alloy such as aluminum neodymium (AlNd), so as to act as a cathode electrode. By the way, if the metallic material is thickly deposited, light does not pass through the metallic material. Accordingly, the second electrode 165 has a double-layered structure including a first layer 165a of the metallic material and a second layer 165b of a transparent conductive material, for example, indium tin oxide or indium zinc oxide. The first layer 165a is disposed under the second layer 165b and contacts the organic emission layer 162. The first layer 165a has a thickness such that transparency is maintained, that is, within a range of about 500 Å to about 3,000 Å. The second layer 165b has a thickness of about 500 Å to about 3,000 Å. The second layer 165b decreases resistance of the second electrode 165 to thereby provide uniform voltages all over the surface of the first substrate 110. If the second electrode 165 includes only the first layer 165a, the second electrode 165 has too thin thickness, and an inner resistance per unit area increases to cause an inner voltage drop. Therefore, voltages cannot be uniformly provided due to the inner voltage drop, and this results in poor brightness. Thus, the second layer 165b prevents the problem.

Meanwhile, in FIG. 4B, the second electrode 165 serves as an anode electrode. The second electrode 165 has a single-layered structure and is formed of a transparent conductive material having a relatively high work function, for example, indium tin oxide or indium tin oxide. The second electrode 165 may have a thickness of about 500 Å to about 3,000 Å. Since the second electrode 165 is formed of the transparent conductive material, it is not necessary that the second electrode 165 have a relatively thin thickness, and the second electrode 165 can have a relatively enough thick thickness considering the inner resistance.

Although not shown in the figures, the organic emission layer 164 may include a single layer or may include multiple layers of a hole injection layer, a hole transporting layer, an emitting material layer, an electron transporting layer and an electron injection layer to improve emission efficiency. In the case that the organic emission layer 164 includes multiple layers, positions of the layers can be changed according to the functions of the first and second electrodes 158 and 165. That is, in FIG. 4A where the first electrode 158 functions as the anode electrode and the second electrode 165 acts as the cathode electrode, the hole injection layer, the hole transporting layer, the emitting material layer, the electron transporting layer and the electron injection layer are sequentially formed on the first electrode 158. On the other hand, in FIG. 4B where the first electrode 158 functions as the cathode electrode and the second electrode 165 acts as the anode electrode, the electron injection layer, the electron transporting layer, the emitting material layer, the hole transporting layer and the hole injection layer are sequentially formed on the first electrode 158.

A transparent second substrate 170 faces and is spaced apart from the first substrate 110 having the above-mentioned elements. The second substrates 170 is attached with the first substrate 110, wherein peripheries of the first and second substrates 110 and 170 are sealed by a seal pattern (not shown).

In the organic electroluminescent display device 101, the x-ray shield layer 153, which shields the switching thin film transistor (not shown) and the driving thin film transistor DTr, more particularly, shields channel areas, is formed of tungsten and is automatically separated and patterned into each pixel region P by the partition wall 148 having a reversely tapered cross-section. Accordingly, the elements over the x-ray shield layer 153 can be formed by an electron beam deposition method.

A method of manufacturing a top emission type organic electroluminescent display device according to the first embodiment of the present invention will be described hereinafter in detail with reference to accompanying drawings.

FIGS. 5A to 5I are cross-sectional views of a substrate for a top emission type organic electroluminescent display device in steps of manufacturing the same according to the first embodiment of the present invention. Here, for example, switching and driving thin film transistors have a bottom gate structure and include intrinsic amorphous silicon as an active layer.

Figure 5A:
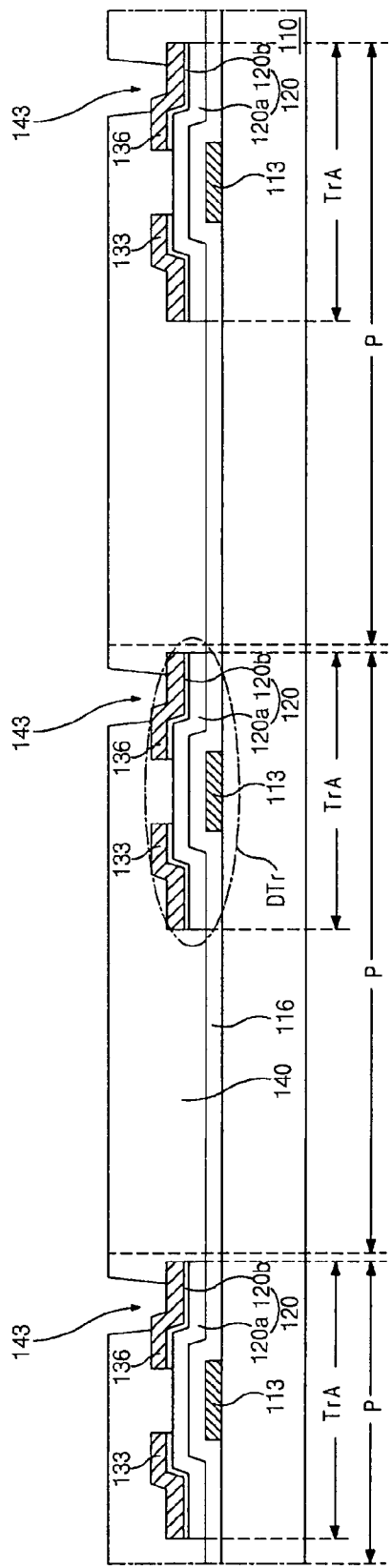
FIGS. 5A to 5I are cross-sectional views of a substrate for a top emission type organic electroluminescent display device in steps of manufacturing the same according to the first embodiment of the present invention.

In FIG. 5A, a gate line (not shown) and a gate electrode 113 are formed on an insulating layer 110 by depositing a metallic material having relatively low resistivity and patterning it through a mask process. The mask process may include applying photoresist to the metallic material, exposing the photoresist to light, developing the light-exposed photoresist and etching the metallic material. The gate line is extended along a first direction. The gate electrode 113 is disposed in a driving area TrA. Although not shown in the figure, a gate electrode is also formed in a switching area, where the switching thin film transistor is disposed, and is connected to the gate line.

A gate insulating layer 116 is formed on the gate line and the gate electrode 113 all over the surface of the substrate 110. A semiconductor layer 120 is formed on the gate insulating layer 116 over the gate electrode 113. The semiconductor layer 120 includes an active layer 120a of intrinsic amorphous silicon and ohmic contact layers 120b of impurity-doped amorphous silicon. The ohmic contact layers 120b are spaced apart from each other over the active layer 120a. Source and drain electrodes 133 and 136 are formed on the ohmic contact layers 120b and are spaced apart from each other. The gate electrode 113, the gate insulating layer 116, the semiconductor layer 120, and the source and drain electrodes 133 and 136 in the driving area TrA form the driving thin film transistor DTr. The switching thin film transistor (not shown) having the same structures as the driving thin film transistor DTr is formed in the switching area (not shown). Here, the semiconductor layer 120 and the source and drain electrodes may be formed through different mask processes or may be formed through the same mask process.

In the meantime, although not shown in the figure, a data line is formed on the gate insulating layer 116 through the same process as the source and drain electrodes 133 and 136. The data line is extended along a second direction and crosses the gate line to define a pixel region P. A source electrode (not shown) of the switching thin film transistor is connected to the data line.

In the first embodiment of the present invention, even though the driving and switching thin film transistors have a bottom gate structure, the driving and switching thin film transistors many have a top gate structure including polycrystalline silicon.

Next, a passivation layer 140 is formed on the driving thin film transistor DTr and the switching thin film transistor (not shown) by applying an organic insulating material, for example, benzocyclobutene (BCB) or photo acryl. The passivation layer 140 has a flat surface. The passivation layer 140 is patterned through a mask process to thereby form a drain contact hole 143 exposing the drain electrode 136 of the driving thin film transistor DTr.

Figure 5B:
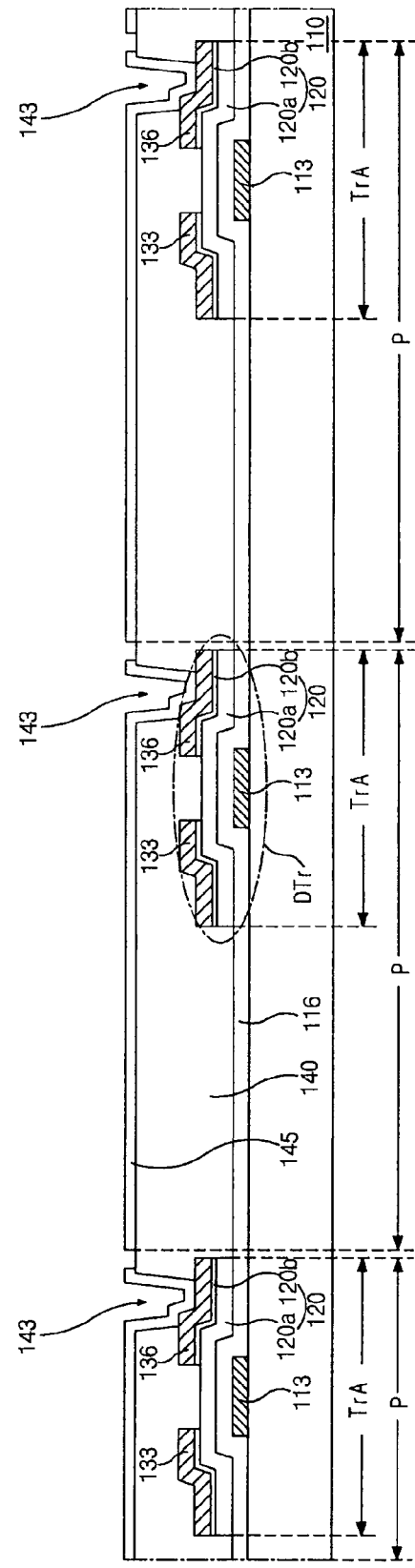

In FIG. 5B, a connection electrode 145 is formed in each pixel region P on the passivation layer 140 having the drain contact hole 143 by depositing a conductive material by a sputtering method and then patterning it through a mask process. The conductive material may be one of aluminum (Al), aluminum alloy such as aluminum neodymium (AlNd), copper (Cu), copper alloy, chromium (Cr), indium tin oxide and indium zinc oxide. The connection electrode 145 is connected to the drain electrode 136 of the driving thin film transistor DTr through the drain contact hole 140.

Figure 5C:
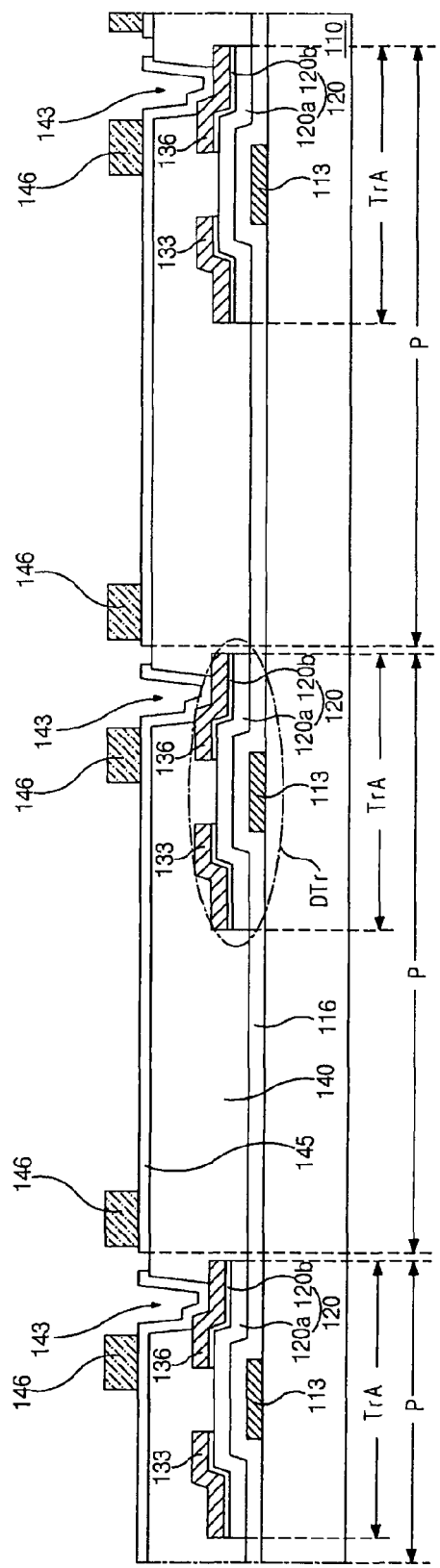

In FIG. 5C, sacrificial patterns 146 are formed on the connection electrode 145 by depositing a sacrificial layer (not shown) and patterning it through a mask process. The sacrificial layer may be formed of a conductive material, which can be wet-etched and etchant of which does not affect the material for the connection electrode 145, for example, molybdenum (Mo). The sacrificial patterns 146 are respectively disposed at both sides of a border between adjacent pixel regions P and overlap edge portions of the pixel region P. The sacrificial patterns 146 may have a thickness of about 2,500 Å to about 5,500 Å, which, desirably, is thicker than a sum of thicknesses of an x-ray shield layer and a first electrode to be formed later. The sacrificial patterns 146 have a double dam structure in a plan view, wherein the sacrificial patterns 146 are spaced apart from each other along the edge portions of the pixel region P at the both sides of the border between adjacent pixel regions P.

Figure 5D:
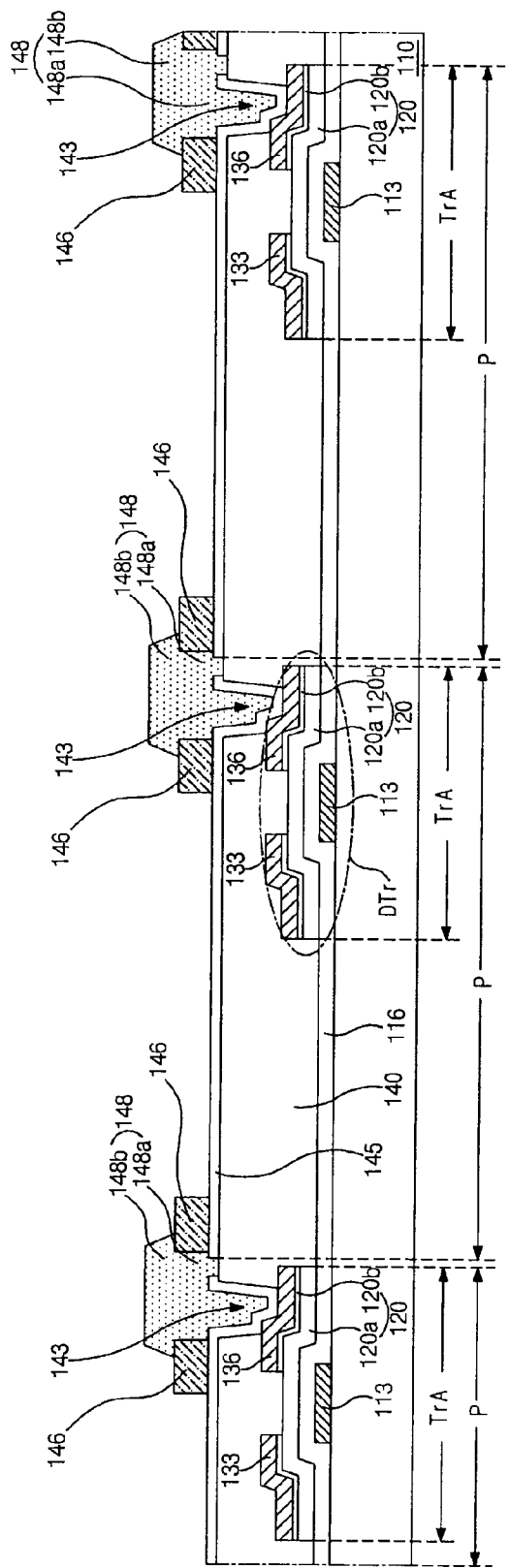

In FIG. 5D, an organic insulating material layer (not shown) is formed on the sacrificial patterns 146 all over the surface of the substrate 110 and is patterned through a mask process to thereby form a partition wall 148. The organic insulating material layer may be formed by applying an organic insulating material, for example, benzocyclobutene (BCB), photo acryl or polyimide, and the organic insulating material layer may be thicker than the sacrificial patterns 146 such that the sacrificial patterns 146 are completely covered. The partition wall 148 includes a lower part 148a and an upper part 148b. The lower part 148a of the partition wall 148 corresponds to an area between the sacrificial patterns 146 having the double dam structure at the border between adjacent pixel regions P. The upper part 148b of the partition wall 148 is disposed over the lower part 148a and has a wider width than the lower part 148a. The partition wall 148 has a cross-section of a mushroom-like shape. The partition wall 148 overlaps and fills the drain contact hole 143.

Figure 5E:
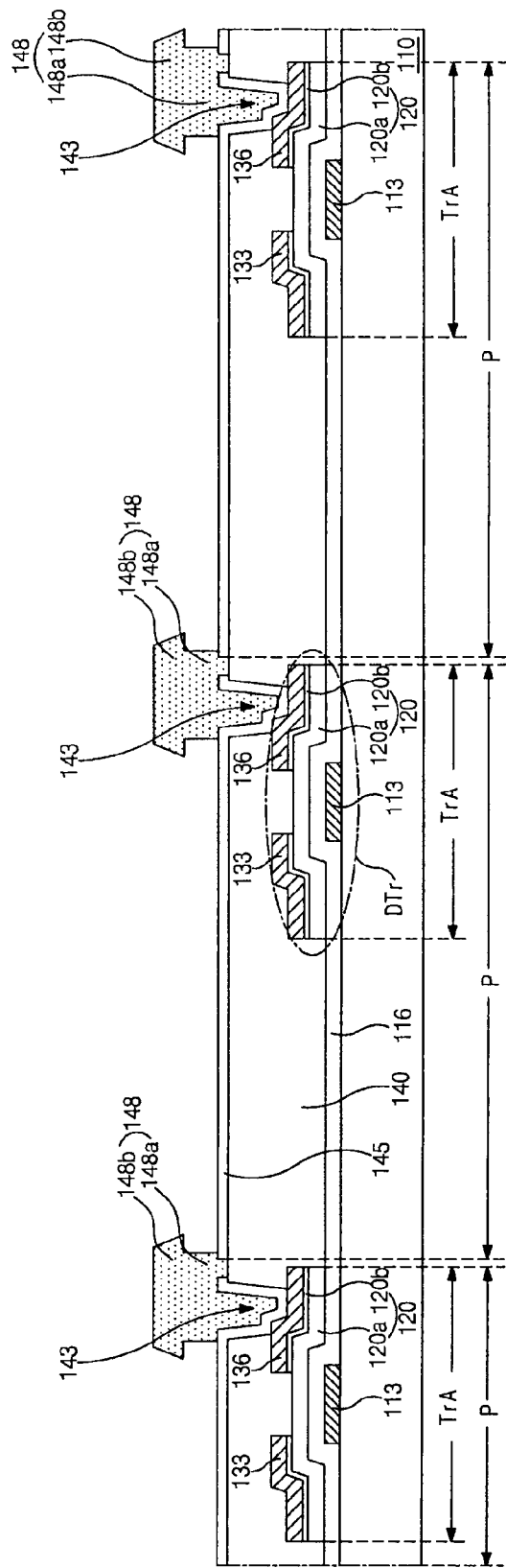

In FIG. 5E, a wet-etching step is carried out to the substrate 110 including the partition wall 148 to thereby remove the sacrificial patterns 146 of FIG. 5D under the upper part 148b of the partition wall. Accordingly, the upper part 148 of the partition wall 148 has an overhang shape as against the lower part 148a, and the lower part 148a has an undercut shape as against the upper part 148b.

Figure 5F:
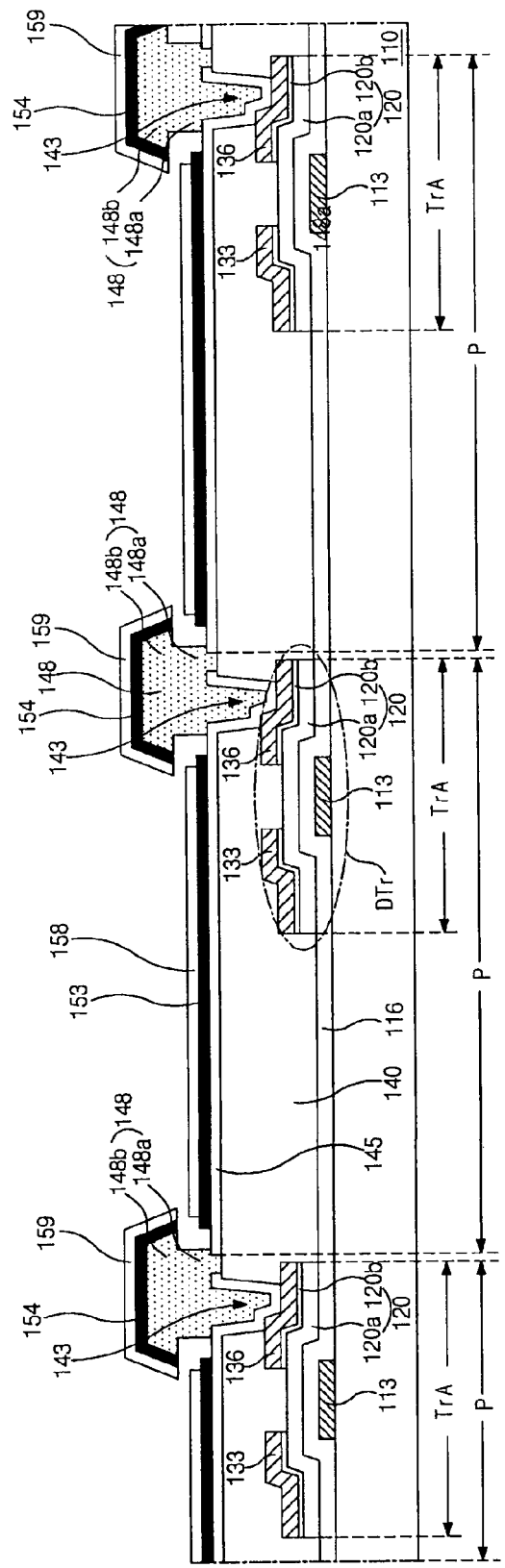

In FIG. 5F, an x-ray shield layer 153 is formed on the connection electrode 145 over the substrate 110, wherein the sacrificial patterns 146 of FIG. 5E are removed, and a first electrode 158 is formed on the x-ray shield layer 153. Furthermore, first and second dummy patterns 154 and 159 are sequentially formed on a top surface and a side surface of the partition wall 148. The first and second dummy patterns 154 and 159, respectively, include the same materials as the x-ray shield layer 153 and the first electrode 158.

More particularly, a metallic material having an atomic density of about 10 g/cm³ to about 30 g/cm³ is deposited all over the surface of the substrate 110 including the partition wall 148, and the x-ray shield layer 153 is automatically separated by the pixel region P due to the partition wall 148. The metallic material, for example, may be tungsten, which has an atomic density of about 19.25 g/cm³. The x-ray shield layer 153 covers the driving thin film transistor DTr in the driving area TrA and the switching thin film transistor (not shown) in the switching region (not shown).

It is desirable that the x-ray shield layer 153 has a thickness within a range of about 2,000 Å to 2,500 Å. If the x-ray shield layer 153 has a thickness less than 2,000 Å, the x-ray shield layer 153 does not completely shield X-ray incident on the driving thin film transistor DTr and the switching thin film transistor (not shown). In this case, off-current characteristics are better than a device without the x-ray shield layer, but they are higher than reference, so that the transistors cannot be used as a switching or driving element.

Figure 6:
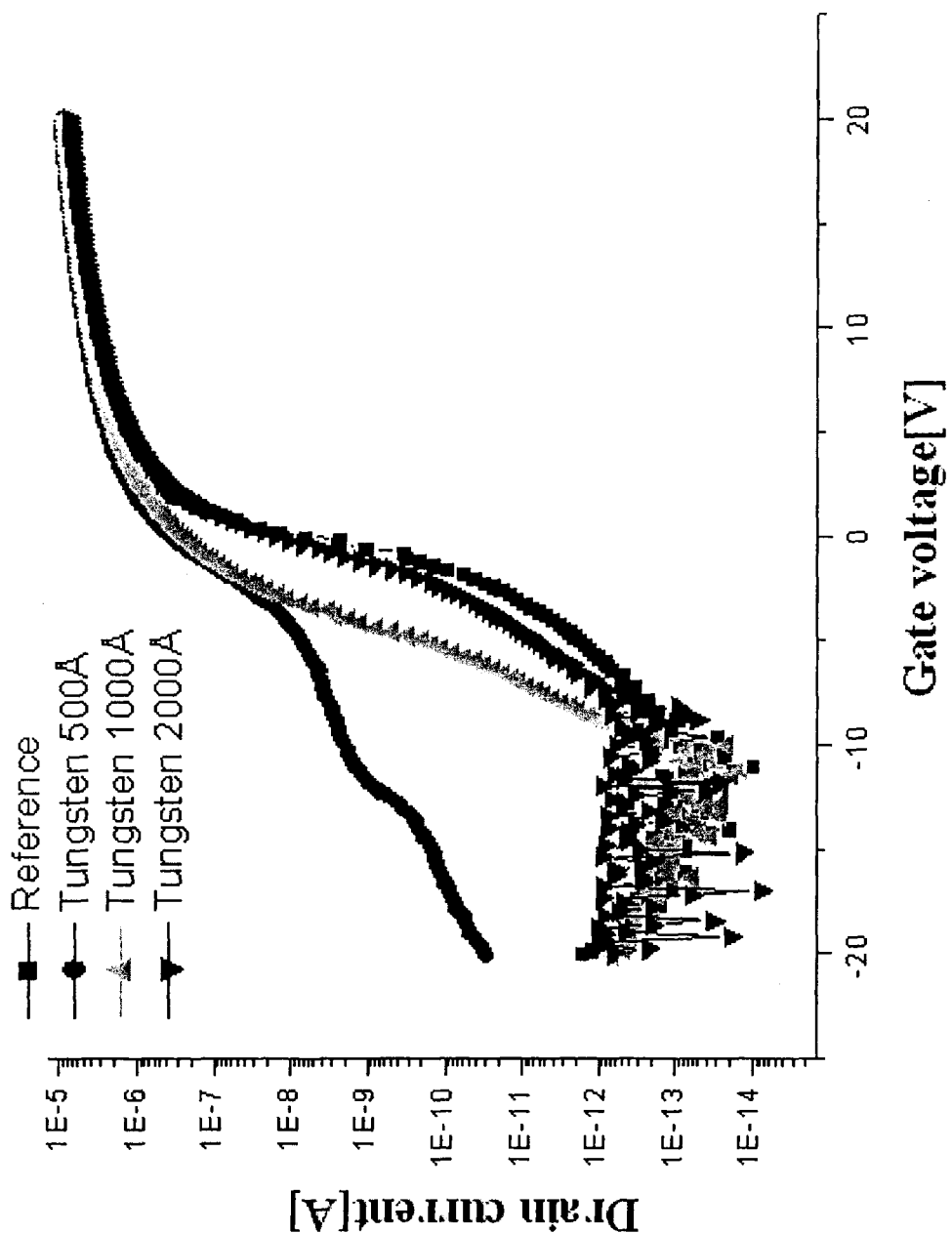
FIG. 6 is a graph showing current-voltage (I-V) curve characteristics according to thicknesses of the x-ray shield layer, which is formed of tungsten.

FIG. 6 is a graph showing current-voltage (I-V) curve characteristics according to thicknesses of the x-ray shield layer, which is formed of tungsten.

In FIG. 6, when the x-ray shield layer of tungsten has the thickness of about 500 Å to about 1,000 Å, off-currents are considerably high as compared with the reference, which is shown as an I-V curve of a thin film transistor that is not exposed to X-ray. Additionally, the I-V curves are different from each other. On the other hand, when the x-ray shield layer has the thickness of about 2,000 Å, the I-V curve is similar to the reference, and there is almost no change in off-currents.

Meanwhile, a transparent conductive material having relatively high work function is formed all over the surface of the substrate 110 including the x-ray shield layer 153 by an electron beam deposition method or a sputtering method, and the first electrode 158 is separated by the pixel region P due to the partition wall 148. The transparent conductive material may be indium tin oxide or indium zinc oxide. The first electrode 158, beneficially, has a thickness within a range of about 500 Å to about 3,000 Å. Here, the first electrode 158 functions as an anode electrode, and the x-ray shield layer 153 under the first electrode 158 acts as a reflector.

Referring to FIG. 4B, when the first electrode 158 functions as a cathode electrode, the first electrode 158 may be formed of a metallic material having relatively low work function and high reflectivity, for example, aluminum (Al), aluminum alloy such as aluminum neodymium (AlNd) or silver (Ag), by an electron beam deposition method. At this time, as stated above, the first electrode 158 may be automatically separated by the pixel region P due to the partition wall 148. It is desirable that the first electrode 158 has a thickness within a range of about 500 Å to 3,000 Å. Within the range, the first electrode 158 is opaque, and the first electrode 158 functions as a reflector to maximize efficiency in a top emission mode.

Figure 5G:
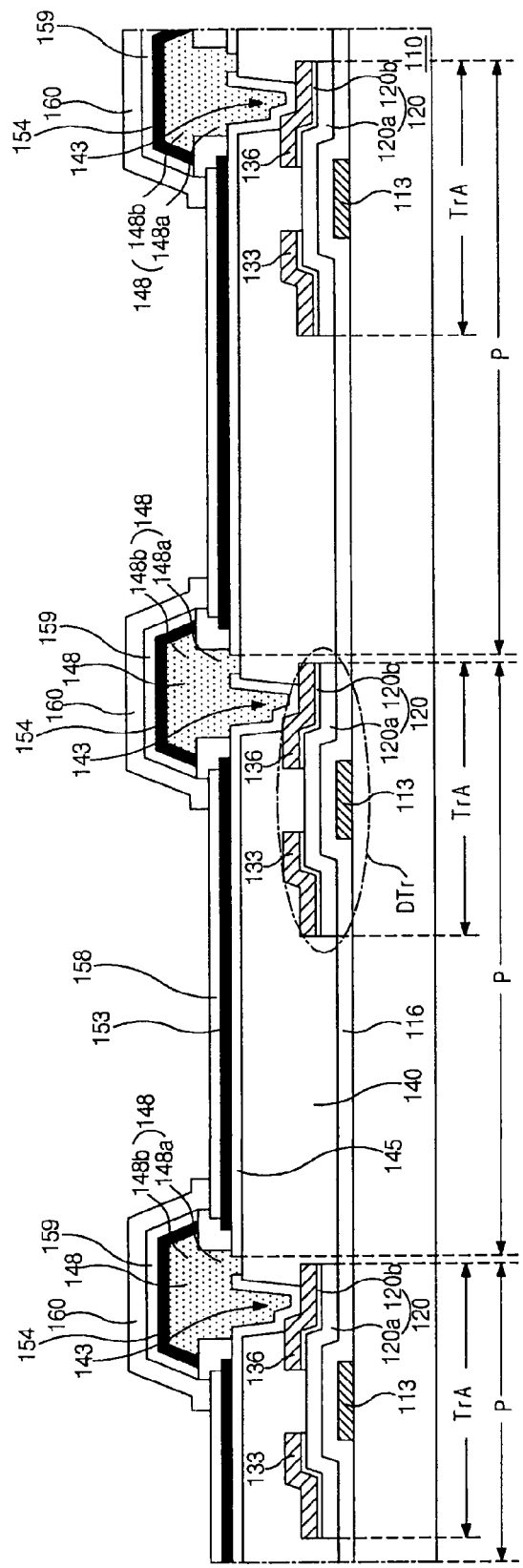

Next, in FIG. 5G, an inorganic insulating layer (not shown) is formed on a substantially entire surface of the substrate 110 including the first electrode 158 by depositing an inorganic insulating material and then is patterned through a mask process, thereby forming a bank 160 over the partition wall 148. The inorganic insulating material may be silicon oxide (SiO₂) or silicon nitride (SiN$_x$), for example. The bank 160 entirely covers the second dummy pattern 159, which is formed simultaneously with the first electrode 158, and both ends of the bank 160 contact edge portions of the first electrode 158.

The inorganic insulating layer is not separated by the pixel region P differently from the first electrode 158 and the x-ray shield layer 153 thereunder. The inorganic insulating layer is continuously formed over the first electrode 158 and the partition wall 148 with a predetermined thickness. Since a distance between a top surface of the pixel region P and a bottom surface of the upper part 148b, that is, a distance between the connection electrode 145 and the upper part 148b, is larger than a total thickness of the x-ray shield layer 153 and the first electrode 158, the x-ray shield layer 153 and the first electrode 158 are disconnected by the pixel region P. However, after forming the x-ray shield layer 153 and the first electrode 158, a distance between a top surface of the pixel region P and the bottom surface of the upper part 148b, that is, a distance between the first electrode 158 and the upper part 148b, decreases due to the x-ray shield layer 153 and the first electrode 158. Therefore, the inorganic insulating layer can be continuously formed by depositing the inorganic insulating material thicker than the distance between the first electrode 158 and the upper part 148b.

Figure 5H:
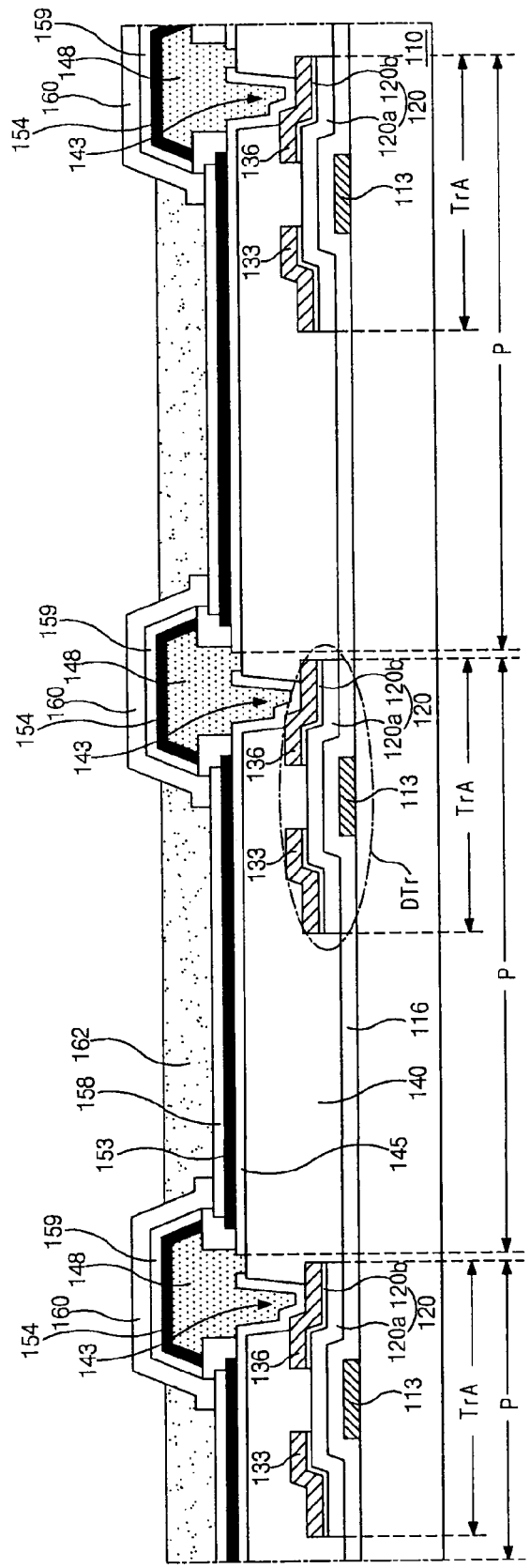

In FIG. 5H, an organic emission layer 162 is formed in the pixel region P between adjacent banks 160. The organic emission layer 162 is disposed on the first electrode 158 and the bank 160. The organic emission layer 162 may include red, green and blue organic luminous patterns each corresponding to the pixel region P and sequentially arranged. In this case, the organic emission layer 162 may be formed by a thermal deposition method using a shadow mask (not shown). Alternatively, the organic emission layer 162 may include a white luminous material all over the surface of the substrate 110. At this time, the organic emission layer 162 may be formed by a nozzle coating method or a spin coating method.

Figure 5I:
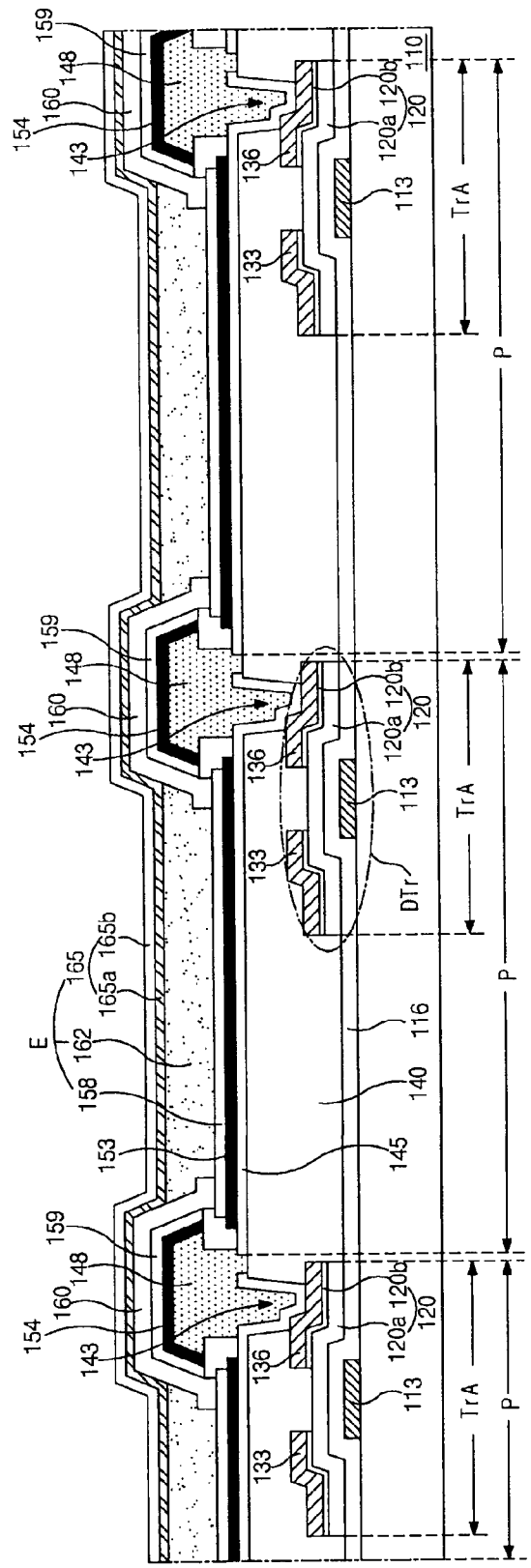

In FIG. 5I, a second electrode 165 is formed on the organic emission layer 162. The second electrode 165 functions as a cathode electrode and have a double-layered structure. More particularly, the second electrode 165 includes a first layer 165a of a metallic material having relatively low work function and a second layer 165b of a transparent conductive material on the first layer 165a. The first layer 165a may be formed by depositing one of aluminum (Al), aluminum alloy of aluminum neodymium (AlNd) and silver (Ag) by an electron beam deposition method. The first layer 165a may have a thickness of about 5 Å to about 50 Å such that light passes through the first layer 165a. The second layer 165b may be formed by depositing indium tin oxide or indium zinc oxide by an electron beam deposition method. The second layer 165b may have a thickness of about 500 Å to about 2,000 Å. The first layer 165a has a very thin thickness so as to keep transparency, and its inner resistance relatively increases. Voltage drops partially occur, and this causes problems in brightness. To solve the problems, the second layer 165b having a common thickness of electrodes is further formed on the first layer 165b and prevents an increase of the inner resistance due to the thin thickness.

Meanwhile, the second electrode may function as an anode electrode as illustrated in FIG. 4B. In this case, the second electrode 165 may be formed to have a thickness of about 500 Å to about 3,000 Å by depositing a transparent conductive material having relatively high work function, for example, indium tin oxide or indium zinc oxide, on the organic emission layer 162 by an electron beam deposition method.

Next, although shown in the figures, a transparent substrate (not shown) is disposed over the substrate 110 including the above-mentioned elements thereon, wherein a seal pattern (not shown) is formed on one of the substrates along its periphery, and the substrates are attached to complete the top emission type organic electroluminescent display device 101 of FIGS. 4A and 4B according to the first embodiment of the present invention. A moisture absorption pattern (not shown) having a hygroscopic property may be further formed inside the seal pattern.

Figure 7A:
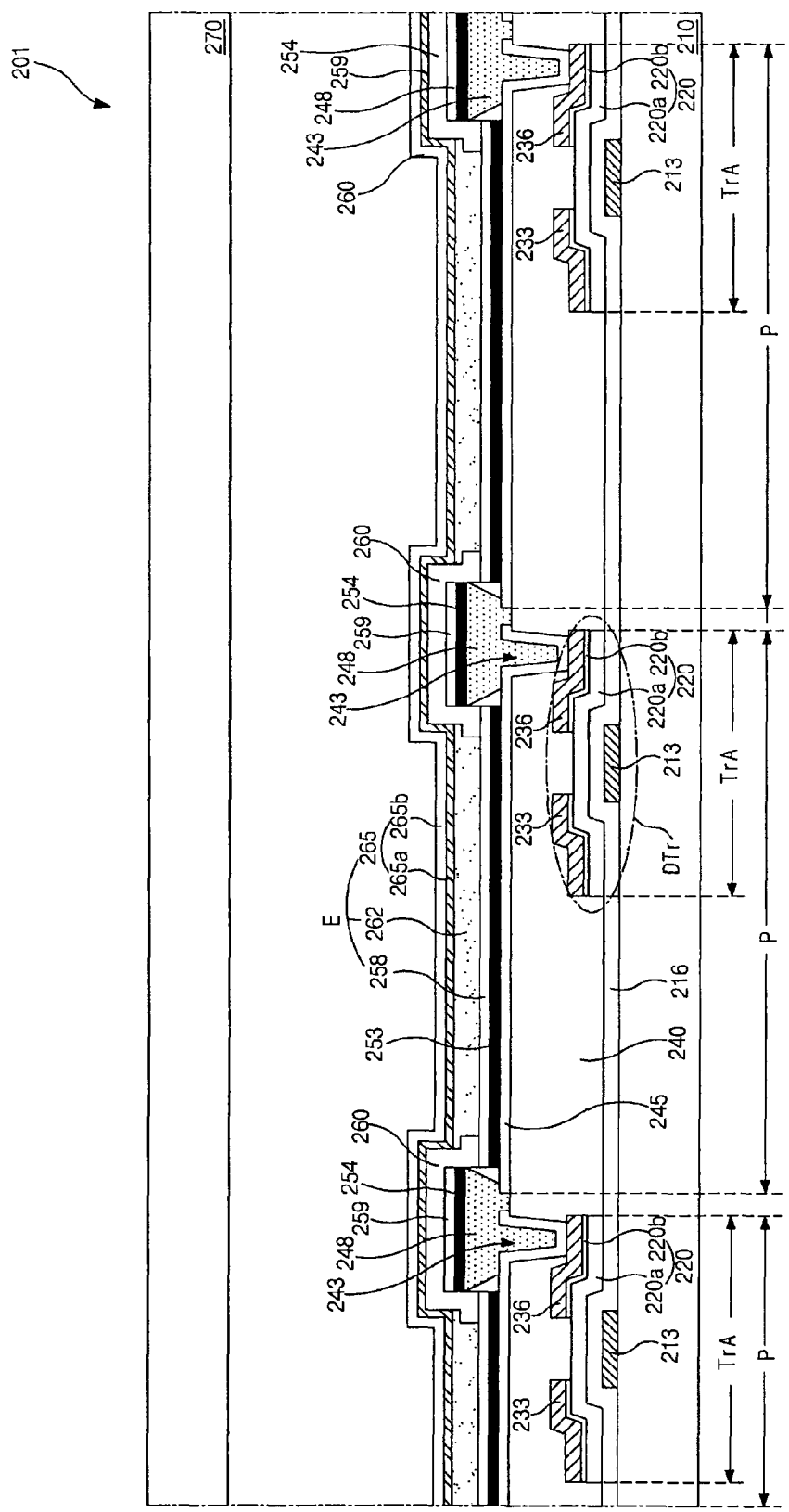
FIGS. 7A and 7B are cross-sectional views illustrating a top emission type organic electroluminescent display device according to a second embodiment of the present invention.
Figure 7B:
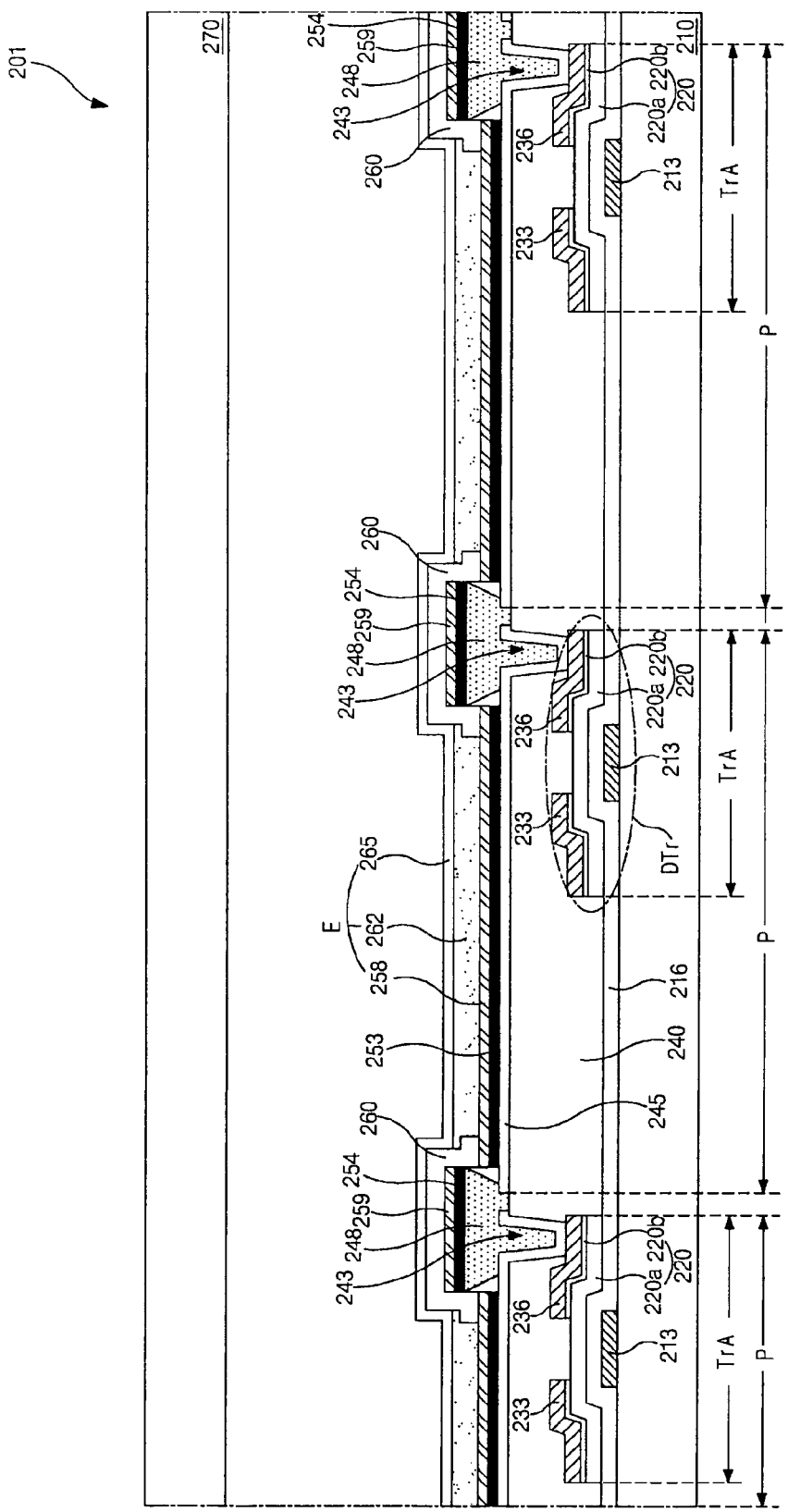

FIGS. 7A and 7B are cross-sectional views illustrating a top emission type organic electroluminescent display device according to a second embodiment of the present invention. FIG. 7A shows an example in which a first electrode functions as an anode electrode, and FIG. 7B shows another example in which the first electrode functions as a cathode electrode. The device according to the second embodiment has the same elements as the first embodiment except for the partition wall. In the second embodiment, explanation for the same parts as the first embodiment will be omitted.

In FIGS. 7A and 7B, the partition wall 248 is formed on the connection electrode 245 and corresponds to a border between adjacent pixel regions P. The partition wall 248 is formed of an inorganic insulating material or an organic insulating material. The partition wall 248 has a cross-section of a reversely tapered shape, a width of which increases from the bottom to the top with respect to the connection electrode 245.

Accordingly, the x-ray shield layer 253 and the first electrode 258 are separated by the pixel region P due to the partition wall 248 having the reversely tapered cross-section and are sequentially disposed on the connection electrode 245. Here, ends of the x-ray shield layer 253 may be substantially coincident with ends of the first electrode 258 because of the reversely tapered structure of the partition wall 248. The first and second dummy patterns 254 and 259, which, respectively, include the same materials as the x-ray shield layer 253 and the first electrode 258, are sequentially formed on the partition wall 248 having the reversely tapered shape.

In the first embodiment, since the partition wall has the mushroom-like shape, the first and second dummy patterns are formed on the tope surface and the side surface of the partition wall. Therefore, the x-ray shield layer, which is formed in the pixel region before the first electrode, has a wider width than the first electrode, that is, the first electrode on the x-ray shield layer has a narrower width than the x-ray shield layer. Ends of the x-ray shield layer are not coincident with ends of the first electrode.

However, in the second embodiment, the first and second dummy patterns 254 and 259 are not formed on the side surface of the partition wall 248. Accordingly, the x-ray shield layer 253 and the first electrode 258 have the same width, and the ends of the x-ray shield layer 253 are coincident with the ends of the first electrode 258.

Here, it is beneficial that a height of the partition wall 248 from the top surface of the connection electrode 245, that is, a distance between the top surface of the partition wall 248 and the top surface of the connection electrode 245, is larger than a total thickness of the x-ray shield layer 253 and the first electrode 258. More particularly, the height of the partition wall 248 from the top surface of the connection electrode 248, desirably, is within a range of about 110% to about 120% of the total thickness of the x-ray shield layer 253 and the first electrode 258 so that the bank 260, which covers the partition wall 248 and the first and second dummy patterns 254 and 259, is not disconnected between the partition wall 248 and the first electrode 258. The bank 260 has a thicker thickness than a distance between the top surface of the partition wall 248 and the top surface of the first electrode 258.

Hereinafter, a method of manufacturing a top emission type organic electroluminescent display device according to the second embodiment of the present invention will be described in detail with reference to accompanying drawings. The method according to the second embodiment has the same steps as the first embodiment except for forming the partition wall. Therefore, explanation for the same steps as the first embodiment will be omitted.

FIGS. 8A to 8E are cross-sectional views of a substrate for a top emission type organic electroluminescent display device in steps of manufacturing the same according to the second embodiment of the present invention.

Figure 8A:
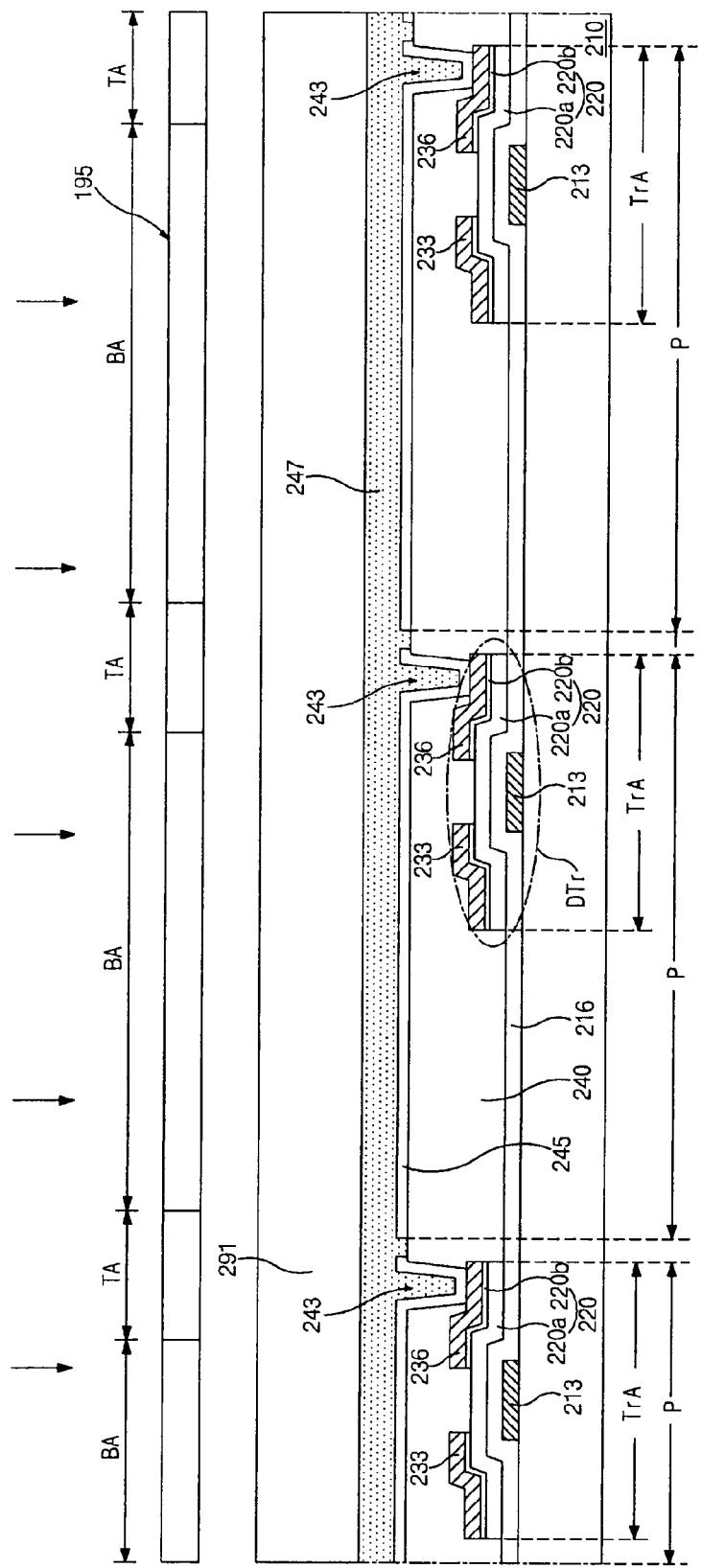
FIGS. 8A to 8E are cross-sectional views of a substrate for a top emission type organic electroluminescent display device in steps of manufacturing the same according to the second embodiment of the present invention.

In FIG. 8A, an inorganic insulating layer 247 is formed substantially all over the surface of the substrate 210 by depositing an inorganic insulating material, for example, silicon oxide ($SiO_2$) or silicon nitride ($SiN_x$) on the connection electrode 245, which contacts the drain electrode 236 of the driving thin film transistor DTr through the drain contact hole 243 and is formed on the passivation layer 240, using chemical vapor deposition apparatus. Since the connection electrode 245 has a substantially even surface without steps, the inorganic insulating layer 247 also has a substantially flat surface all over the surface except for a portion corresponding to the drain contact hole 243. Even though the portion corresponding to drain contact hole 243 is shown flat in the figure, a recession may be formed due to the deposition properties of the inorganic insulating material. However, this is not a problem because the drain contact hole 243 has a relatively very small size as compared to the pixel region P.

A thickness of the inorganic insulating layer 247 is thicker than a sum of thicknesses of the x-ray shield layer and the first electrode to be formed later. Beneficially, the inorganic insulating layer 247 may have a thickness of about 3,000 Å to 5,000 Å. At this time, a deposition rate of the inorganic insulating material is relatively high at first, and the deposition rate is gradually decreased such that the inorganic insulating layer 247 has a relatively low density near by the connection electrode 253 and has an increasing density according as it becomes far from the connection electrode 253.

Next, a photoresist layer 291 is formed all over the surface by applying photoresist on the inorganic insulating layer 247, and the photoresist layer 291 is exposed to light through a mask 195 including a light-transmitting portion TA and a light-blocking portion BA.

Figure 8B:
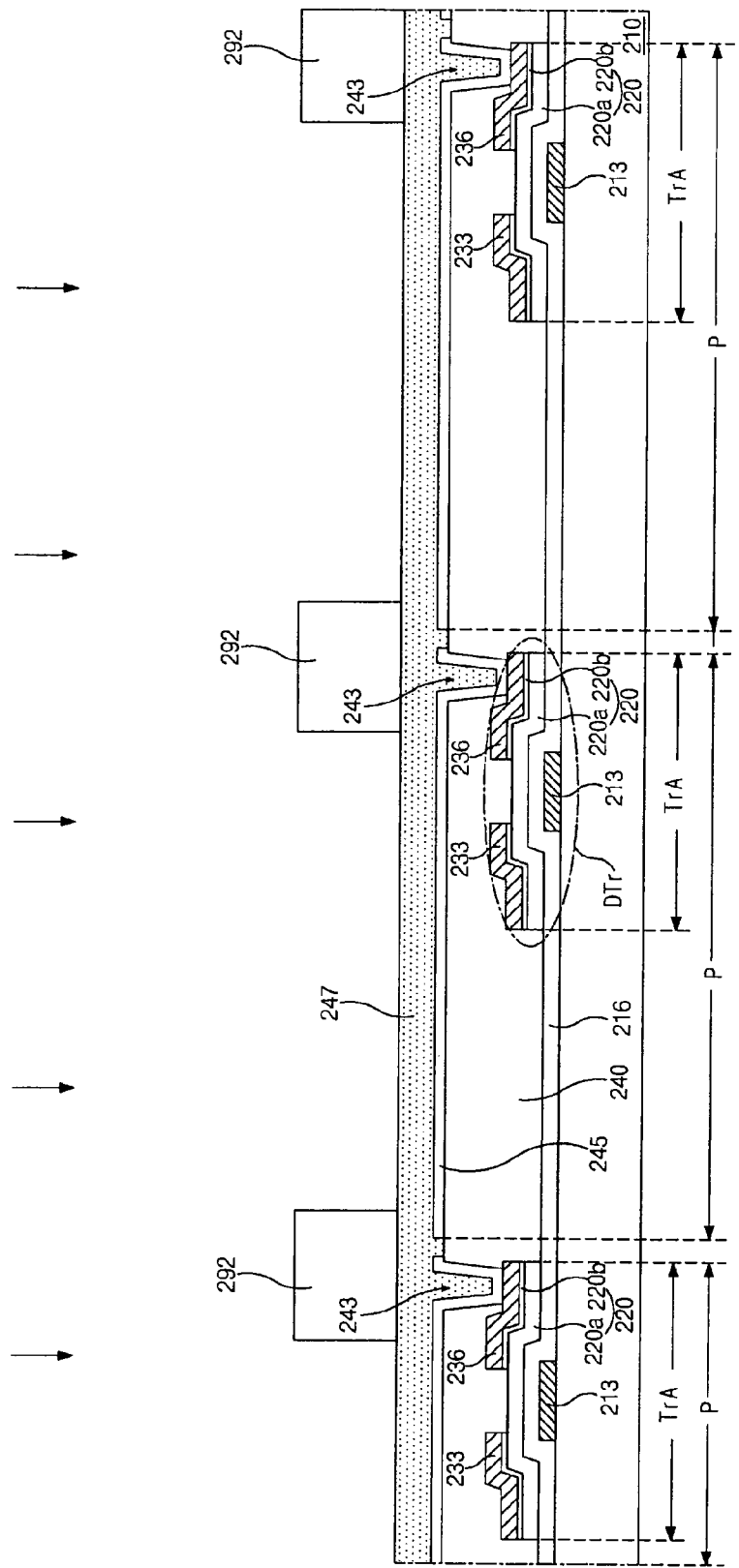

In FIG. 8B, the light-exposed photoresist layer 291 of FIG. 8A is developed to thereby form a photoresist pattern 292 on the inorganic insulating layer 247. The photoresist pattern corresponds to the border between adjacent pixel regions P.

Isotropic dry-etching is applied to the inorganic insulating layer 247 exposed by the photoresist pattern 292. In the isotropic dry-etching, a thickness of the inorganic insulating layer 247 decreases at its upper and side surfaces. The etch rate at the upper surface of the inorganic insulating layer 247 is higher than the etch rate at the side surface of the inorganic insulating layer 247. The etch rate at the side surface of the inorganic insulating layer 247 decreases as it approaches the photoresist pattern 292. Moreover, since the inorganic insulating layer 247 has a decreasing density from the top surface to the bottom surface, the etch rate near by the bottom surface, which is close to the connection electrode 245, is higher than the etch rate near by the top surface. Accordingly, in an area around the connection electrode 245, the side surface of the inorganic insulating layer 247 is faster etched near by the bottom surface than near by the upper surface, and as shown in FIG. 8C, the partition wall 247 having a reversely tapered cross-section is formed.

Figure 8C:
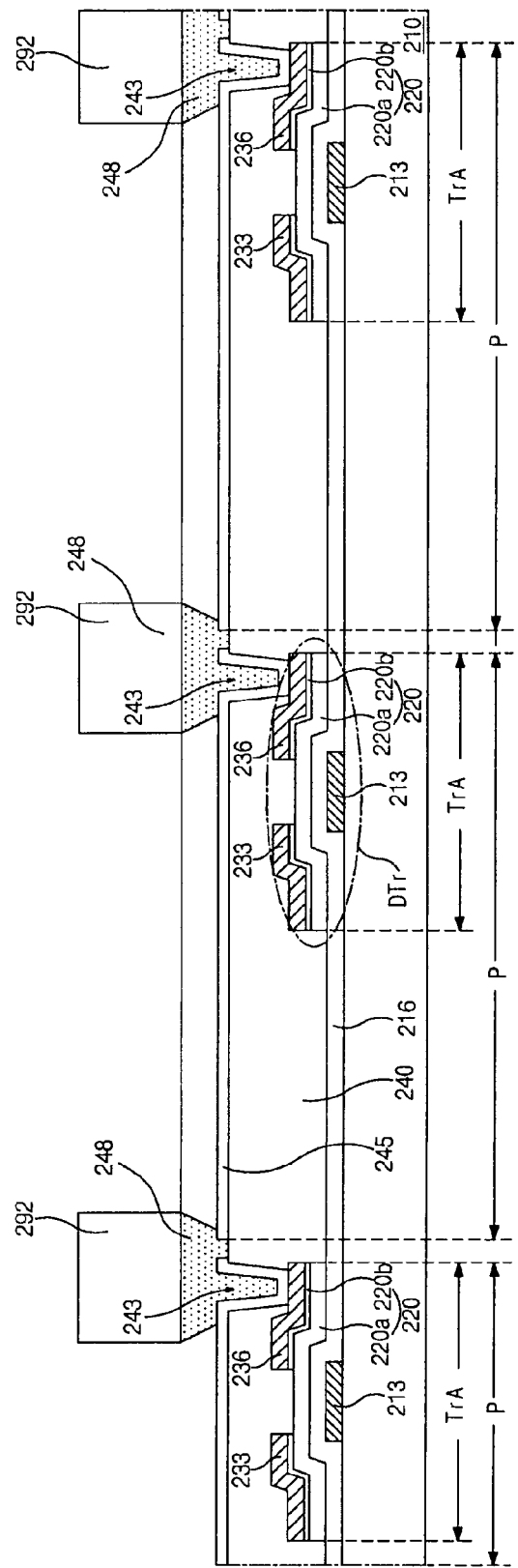
Figure 8D:
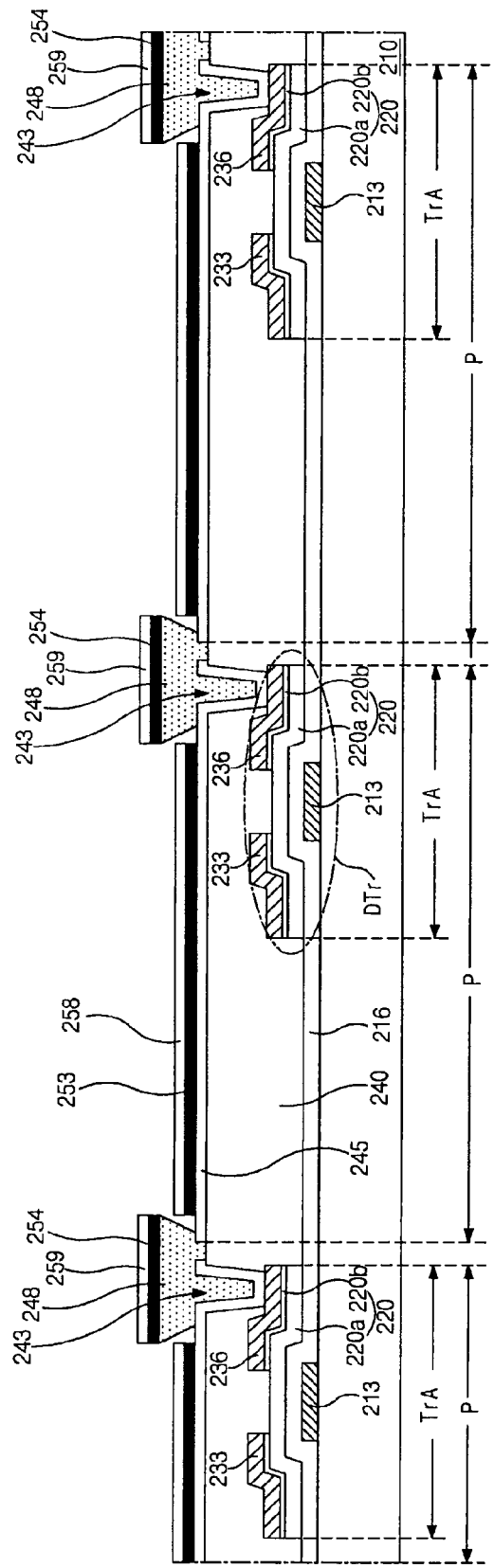

In FIG. 8D, the photoresist pattern 292 of FIG. 8C on the partition wall 248 is removed by performing a stripping or ashing step.

Figure 8E:
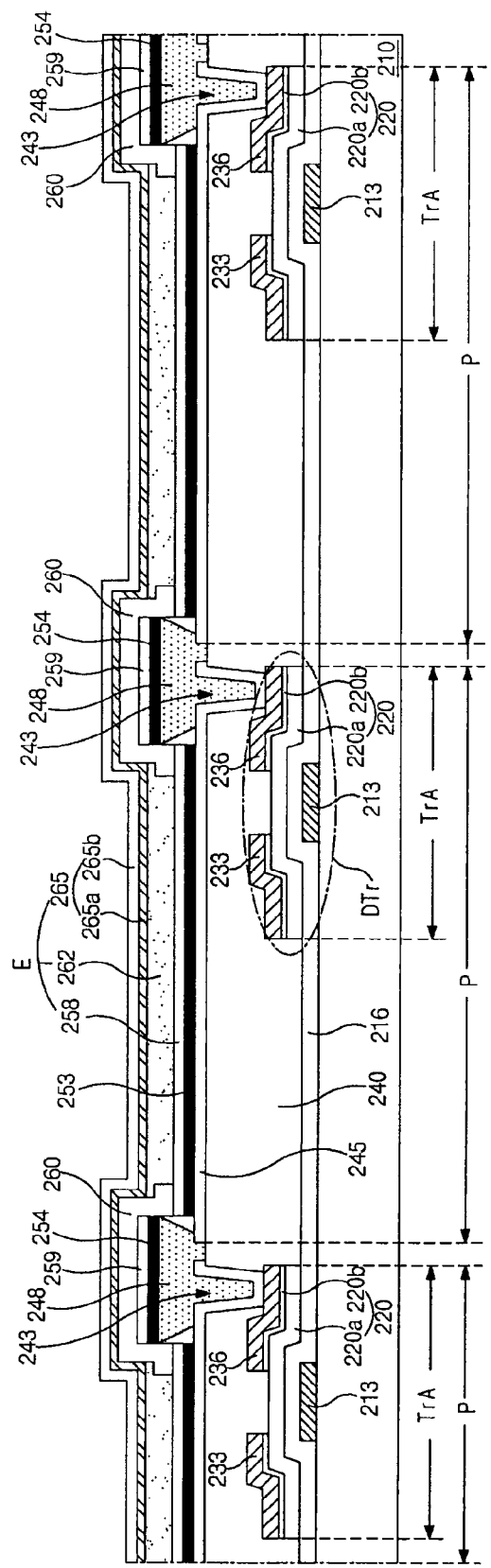

In FIG. 8E, the same steps as the first embodiment are applied to the partition wall 248 having the reversely tapered structure and the connection electrode exposed by the partition wall 248, whereby the x-ray shield layer 253 and the first electrode 258 are automatically separated by the pixel region P due to the partition wall 248, and the organic emission layer 262 and the second electrode 265 are sequentially formed. Therefore, completed is the substrate for the organic electroluminescent display device according to the second embodiment of the present invention.

Next, referring to FIG. 7A, the transparent substrate 270 is disposed over the substrate 210 including the above-mentioned elements thereon, wherein a seal pattern (not shown) is formed on one of the substrates 210 and 270 along its periphery, and the substrates 210 and 270 are attached to complete the top emission type organic electroluminescent display device 201 according to the second embodiment of the present invention. A moisture absorption pattern (not shown) having a hygroscopic property may be further formed inside the seal pattern.

As another example of the second embodiment, the partition wall may be formed on an organic insulating material. More particularly, an organic insulating material layer (not shown) having a flat surface may be formed on the connection electrode by applying a photosensitive organic insulating material. The organic insulating material layer may be exposed to light and developed to thereby form the partition wall having the reversely tapered cross-section. At this time, the organic insulating material may have a negative photosensitive property, in which a portion exposed to light remains after developing. In a negative photosensitive material, a portion exposed to light is not removed because chemical reactions with light strongly occurs according to intensity of light and exposing time. When the organic insulating material layer is exposed to light, there is a difference in the intensities of light reaching the top surface and the bottom surface of the organic insulating material layer. That is, the intensity of light is relatively high at the top surface of the organic insulating material layer, and the photosensitive organic insulating material sufficiently reacts with light, whereby the portion exposed to light substantially entirely remains after developing. However, the intensity of light decrease toward the bottom surface of the organic insulating material layer, and specially, light is diffused around a border between the light-transiting portion and the light-blocking portion due to refraction, etc. Therefore, the photosensitive organic material does not sufficiently react with light. According to this, the partition wall of the organic insulating material has the reversely tapered cross-section after light-exposing and developing.

In the top emission type organic electroluminescent display device, since the x-ray shield layer of tungsten is formed over the switching or driving thin film transistor, X-ray incident on the channel of the thin film transistor can be blocked. Thus, an electron beam deposition method can be used, and the properties of the thin film transistor can be prevented from being lowered due to the electron beam deposition method.

In addition, the x-ray shield layer of tungsten is automatically patterned by the pixel region, and a wet-etching process for patterning can be omitted. Therefore, costs for additional equipment are not required.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of fabricating a top emission type organic electroluminescent display device, comprising:
   forming a switching thin film transistor and a driving thin film transistor in a pixel region on a first substrate;
   forming a passivation layer over the switching thin film transistor and the driving thin film transistor, the passivation layer having a drain contact hole exposing a drain electrode of the driving thin film transistor;
   forming a connection electrode in the pixel region on the passivation layer, the connection electrode contacting the drain electrode of the driving thin film transistor through the drain contact hole;
   forming a partition wall on the connection electrode and corresponding to a border between adjacent pixel regions, the partition wall overlapping an edge portion of the connection electrode having a width of a top surface wider than a width of a bottom surface;
   forming an x-ray shield layer on the connection electrode and separated in the pixel region due to the partition wall such that the x-ray shield layer is formed between the adjacent partition walls by depositing tungsten over a substantially entire surface of the first substrate;
   forming a first electrode on the x-ray shield layer and separated in the pixel region due to the partition wall;
   forming a bank of an inorganic insulating material, the bank covering the partition wall and contacting an edge portion of the first electrode;
   forming an organic emission layer on the first electrode between adjacent banks;
   forming a second electrode on the organic emission layer by an electron beam deposition method; and
   attaching the first substrate and a second substrate such that a seal pattern is formed between the first and second substrates along peripheries of the first and second substrates.

2. The method according to claim 1, wherein forming the partition wall includes:
   forming a sacrificial layer on the connection electrode;
   forming sacrificial patterns by patterning the sacrificial layer, wherein the sacrificial patterns are disposed at both sides of the border between adjacent pixel regions, respectively, and are spaced apart from each other;
   forming an organic insulating layer covering the sacrificial patterns and over a substantially entire surface of the first substrate;
   forming a first part and a second part of the partition wall by patterning the organic insulating layer, wherein the firs part is disposed between the sacrificial patterns, and the second part is disposed on the first part and the sacrificial patterns; and
   removing the sacrificial patterns.

3. The method according to claim 2, wherein the sacrificial patterns has a thickness thicker than a sum of thicknesses of the x-ray shield layer and the first electrode and thinner than a sum of thicknesses of the x-ray shield layer, the first electrode and the bank.

4. The method according to claim 1, wherein forming the partition wall includes:
   forming an inorganic insulating layer on the connection electrode, wherein the inorganic insulating layer has an increasing density from the connection electrode to a top surface of the inorganic insulating layer;

forming a photoresist pattern on the inorganic insulating layer and corresponding to the border between adjacent pixel regions;

patterning the inorganic insulating layer using the photoresist pattern as an etching mask by an isotropic dry-etching method; and removing the photoresist pattern.

5. The method according to claim 1, wherein forming the partition wall includes:

forming an organic insulating layer covering the connection electrode and over a substantially entire surface of the first substrate, the organic insulating layer being a negative photosensitive type;

exposing the organic insulating layer to light using a mask, which includes a light-transmitting portion corresponding to the border between adjacent pixel regions; and developing the organic insulating layer exposed to light.

* * * * *